United States Patent
Kashyap et al.

(10) Patent No.: US 9,353,439 B2
(45) Date of Patent: May 31, 2016

(54) CASCADE DESIGN SHOWERHEAD FOR TRANSIENT UNIFORMITY

(71) Applicant: Novellus Systems, Inc., Fremont, CA (US)

(72) Inventors: Dhritiman S. Kashyap, Bangalore (IN); David G. Cohen, San Jose, CA (US); Davinder Sharma, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 306 days.

(21) Appl. No.: 13/857,799

(22) Filed: Apr. 5, 2013

(65) Prior Publication Data

US 2014/0299681 A1 Oct. 9, 2014

(51) Int. Cl.
*C23C 16/455* (2006.01)
*H01J 37/32* (2006.01)

(52) U.S. Cl.
CPC ..... *C23C 16/45525* (2013.01); *C23C 16/45563* (2013.01); *C23C 16/45565* (2013.01); *C23C 16/45591* (2013.01); *H01J 37/3244* (2013.01); *H01J 37/32449* (2013.01); *H01J 37/32633* (2013.01)

(58) Field of Classification Search
CPC .......... C23C 16/45563; C23C 16/45565; C23C 16/45525; C23C 16/45591; H01J 37/32633; H01J 37/3244; H01J 37/32449
USPC .......... 118/715–733; 156/345.1–345.55
See application file for complete search history.

(56) References Cited

U.S. PATENT DOCUMENTS

| | | | |
|---|---|---|---|
| 4,315,173 A * | 2/1982 | Calfo et al. | 310/53 |
| 4,647,512 A | 3/1987 | Venkataramanan et al. | |
| 4,671,204 A | 6/1987 | Ballou | |
| 5,213,650 A | 5/1993 | Wang et al. | |
| 5,223,001 A | 6/1993 | Saeki | |
| 5,232,508 A | 8/1993 | Arena et al. | |
| 5,268,034 A | 12/1993 | Vukelic | |
| 5,314,574 A | 5/1994 | Takahashi | |
| 5,534,073 A | 7/1996 | Kinoshita et al. | |
| 5,578,132 A | 11/1996 | Yamaga et al. | |
| 5,622,606 A * | 4/1997 | Kugler et al. | 204/192.12 |

(Continued)

FOREIGN PATENT DOCUMENTS

| | | | |
|---|---|---|---|
| JP | 5-308071 A | 11/1993 | |
| JP | 2004-256479 | 9/2004 | |

(Continued)

OTHER PUBLICATIONS

"Atomic Layer Deposition of Metal Oxide Thin Films," A thesis presented by Dennis Michael Hausmann, Harvard University, 186 pages, Jul. 2002.

(Continued)

*Primary Examiner* — Jeffrie R Lund
(74) *Attorney, Agent, or Firm* — Weaver Austin Villeneuve & Sampson LLP

(57) ABSTRACT

An apparatus for use in semiconductor processing operations to distribute process gases across a semiconductor wafer. The apparatus may include one or more annular baffles arranged in a stack of annular baffle layers within a plenum volume of the apparatus. Each annular baffle may have a mid-diameter substantially equal to and inner diameter or outer diameter of a baffle in the annular baffle layer above it. The annular baffles may be arranged in a cascading fashion.

35 Claims, 15 Drawing Sheets

(56) References Cited

U.S. PATENT DOCUMENTS

| | | | |
|---|---|---|---|
| 5,681,614 A | 10/1997 | Omori et al. | |
| 5,728,425 A | 3/1998 | Ebe et al. | |
| 5,730,801 A | 3/1998 | Tepman et al. | |
| 5,789,322 A | 8/1998 | Brown et al. | |
| 5,855,465 A | 1/1999 | Boitnott et al. | |
| 5,883,017 A | 3/1999 | Tepman et al. | |
| 5,884,009 A | 3/1999 | Okase | |
| 5,891,251 A | 4/1999 | MacLeish et al. | |
| 5,992,453 A * | 11/1999 | Zimmer | B05C 1/10 137/561 A |
| 6,013,155 A | 1/2000 | McMillin et al. | |
| 6,030,881 A | 2/2000 | Papasouliotis et al. | |
| 6,095,085 A | 8/2000 | Agarwal | |
| 6,132,814 A | 10/2000 | Livesay et al. | |
| 6,191,011 B1 | 2/2001 | Gilboa et al. | |
| 6,241,825 B1 | 6/2001 | Wytman | |
| 6,245,149 B1 | 6/2001 | de Lomenie et al. | |
| 6,316,063 B1 | 11/2001 | Andideh et al. | |
| 6,335,261 B1 | 1/2002 | Natzle et al. | |
| 6,338,626 B1 | 1/2002 | Saeki | |
| 6,352,943 B2 | 3/2002 | Maeda et al. | |
| 6,352,953 B1 | 3/2002 | Seki et al. | |
| 6,409,837 B1 | 6/2002 | Hillman | |
| 6,415,736 B1 * | 7/2002 | Hao et al. | 118/723 E |
| 6,455,098 B2 | 9/2002 | Tran et al. | |
| 6,477,980 B1 | 11/2002 | White et al. | |
| 6,502,530 B1 * | 1/2003 | Turlot | C23C 16/455 118/723 E |
| 6,503,330 B1 | 1/2003 | Sneh et al. | |
| 6,511,539 B1 | 1/2003 | Raaijmakers | |
| 6,534,395 B2 | 3/2003 | Werkhoven et al. | |
| 6,534,802 B1 | 3/2003 | Schuegraf | |
| 6,540,838 B2 | 4/2003 | Sneh et al. | |
| 6,551,339 B2 | 4/2003 | Gavronsky | |
| 6,551,399 B1 | 4/2003 | Sneh et al. | |
| 6,586,349 B1 | 7/2003 | Jeon et al. | |
| 6,626,718 B2 | 9/2003 | Hiroki | |
| 6,663,714 B2 | 12/2003 | Mizuno et al. | |
| 6,716,287 B1 | 4/2004 | Santiago et al. | |
| 6,726,520 B2 | 4/2004 | Takeda et al. | |
| 6,793,733 B2 | 9/2004 | Janakiraman et al. | |
| 6,821,180 B2 | 11/2004 | Kimura et al. | |
| 6,835,417 B2 | 12/2004 | Saenger et al. | |
| 6,848,961 B2 | 2/2005 | Nomura et al. | |
| 6,867,152 B1 | 3/2005 | Hausmann et al. | |
| 6,867,309 B2 | 3/2005 | Chen et al. | |
| 6,884,738 B2 | 4/2005 | Asai et al. | |
| 6,921,456 B2 | 7/2005 | Biberger et al. | |
| 6,958,301 B2 | 10/2005 | Kim et al. | |
| 6,972,203 B2 | 12/2005 | Azuma | |
| 7,077,917 B2 | 7/2006 | Jones | |
| 7,097,878 B1 | 8/2006 | Rulkens et al. | |
| 7,109,129 B1 | 9/2006 | Papasouliotis | |
| 7,129,189 B1 | 10/2006 | Hausmann et al. | |
| 7,135,418 B1 | 11/2006 | Papasouliotis | |
| 7,148,155 B1 | 12/2006 | Tarafdar et al. | |
| 7,151,005 B2 | 12/2006 | Azuma | |
| 7,189,427 B2 | 3/2007 | Takeda et al. | |
| 7,225,820 B2 | 6/2007 | Jones | |
| 7,235,459 B2 | 6/2007 | Sandhu | |
| 7,255,772 B2 | 8/2007 | Biberger et al. | |
| 7,326,097 B2 | 2/2008 | Nomura et al. | |
| 7,381,578 B2 | 6/2008 | Azuma | |
| 7,422,636 B2 | 9/2008 | Ishizaka | |
| 7,481,882 B2 | 1/2009 | Won et al. | |
| 7,491,036 B2 | 2/2009 | Parent et al. | |
| 7,511,425 B2 | 3/2009 | Tsuda et al. | |
| 7,670,432 B2 | 3/2010 | Li | |
| 7,737,035 B1 | 6/2010 | Lind et al. | |
| 7,790,633 B1 | 9/2010 | Tarafdar et al. | |
| 7,993,457 B1 | 8/2011 | Krotov et al. | |
| 2001/0002280 A1 | 5/2001 | Sneh | |
| 2001/0036682 A1 | 11/2001 | Takeda et al. | |
| 2001/0042514 A1 | 11/2001 | Mizuno et al. | |
| 2002/0009944 A1 | 1/2002 | Ouchi | |
| 2002/0059904 A1 | 5/2002 | Doppelhammer | |
| 2002/0100418 A1 | 8/2002 | Sandhu et al. | |
| 2002/0123230 A1 | 9/2002 | Hubacek | |
| 2002/0127436 A1 | 9/2002 | Shibamoto et al. | |
| 2002/0139302 A1 | 10/2002 | Nagashima | |
| 2002/0157960 A1 | 10/2002 | Dordi et al. | |
| 2002/0195683 A1 | 12/2002 | Kim et al. | |
| 2003/0008602 A1 | 1/2003 | Ashjaee et al. | |
| 2003/0010452 A1 * | 1/2003 | Park et al. | 156/345.33 |
| 2003/0015764 A1 | 1/2003 | Raaijmakers et al. | |
| 2003/0023338 A1 | 1/2003 | Chin et al. | |
| 2003/0031807 A1 | 2/2003 | Elers et al. | |
| 2003/0059535 A1 | 3/2003 | Luo et al. | |
| 2003/0109094 A1 | 6/2003 | Seidel et al. | |
| 2003/0121537 A1 | 7/2003 | Dunn | |
| 2003/0134038 A1 | 7/2003 | Paranjpe | |
| 2003/0185977 A1 | 10/2003 | Kalynushkin et al. | |
| 2003/0207032 A1 | 11/2003 | Ahn et al. | |
| 2003/0209324 A1 | 11/2003 | Fink | |
| 2003/0232512 A1 | 12/2003 | Dickinson et al. | |
| 2004/0004247 A1 | 1/2004 | Forbes et al. | |
| 2004/0033662 A1 | 2/2004 | Lee et al. | |
| 2004/0043149 A1 | 3/2004 | Gordon et al. | |
| 2004/0044127 A1 | 3/2004 | Okubo et al. | |
| 2004/0102031 A1 | 5/2004 | Kloster et al. | |
| 2004/0134611 A1 | 7/2004 | Kato et al. | |
| 2004/0203254 A1 | 10/2004 | Conley et al. | |
| 2004/0206267 A1 | 10/2004 | Sambasivan et al. | |
| 2004/0224496 A1 | 11/2004 | Cui et al. | |
| 2005/0054213 A1 | 3/2005 | Derderian et al. | |
| 2005/0112282 A1 | 5/2005 | Gordon et al. | |
| 2005/0178336 A1 | 8/2005 | Liu | |
| 2005/0181617 A1 | 8/2005 | Bosch | |
| 2005/0191803 A1 | 9/2005 | Matsuse et al. | |
| 2005/0260357 A1 | 11/2005 | Olsen et al. | |
| 2005/0269030 A1 | 12/2005 | Kent et al. | |
| 2006/0027611 A1 * | 2/2006 | Hobbs | 222/564 |
| 2006/0038293 A1 | 2/2006 | Rueger et al. | |
| 2006/0112876 A1 | 6/2006 | Choi et al. | |
| 2006/0213439 A1 | 9/2006 | Ishizaka | |
| 2007/0116872 A1 | 5/2007 | Li et al. | |
| 2007/0116873 A1 | 5/2007 | Li et al. | |
| 2007/0157683 A1 | 7/2007 | Li | |
| 2007/0209588 A1 | 9/2007 | Li | |
| 2007/0209590 A1 | 9/2007 | Li | |
| 2007/0212484 A1 | 9/2007 | Li | |
| 2007/0275569 A1 | 11/2007 | Moghadam et al. | |
| 2008/0081114 A1 | 4/2008 | Johanson et al. | |
| 2010/0173074 A1 | 7/2010 | Juarez et al. | |
| 2012/0222815 A1 * | 9/2012 | Sabri et al. | 156/345.34 |
| 2014/0061324 A1 * | 3/2014 | Mohn et al. | 239/1 |
| 2014/0299681 A1 * | 10/2014 | Kashyap | C23C 16/45525 239/553.5 |
| 2015/0167168 A1 * | 6/2015 | Keshavamurthy | C23C 16/45565 438/758 |

FOREIGN PATENT DOCUMENTS

| | | |
|---|---|---|
| WO | WO02/27063 | 4/2002 |
| WO | WO03/083167 | 9/2003 |
| WO | WO 2008/042032 | 4/2008 |

OTHER PUBLICATIONS

Hausmann et al., "Rapid Vapor Deposition of Highly Conformal Silica Nanolaminates," Science, vol. 308, Oct. 2002, 5 Pages.

Gordon et al., "A Kinetic Model for Step Coverage by Atomic Layer Deposition in Narrow Holes or Trenches", Chemical Vapor Deposition 2003, 9, No. 2, pp. 73-78.

Greer et al., "Method and Apparatus to Reduce the Frequency of Chamber Cleans in Rapid Vapor Deposition (RVD) of Silicon Oxide", Novellus Systems, Inc., filed Jul. 12, 2004, U.S. Appl. No. 10/890,376, pp. 1-25.

U.S. Office Action mailed Sep. 22, 2005, from U.S. Appl. No. 10/874,814.

U.S. Office Action mailed Jun. 23, 2005, from U.S. Appl. No. 10/874,808.

(56) References Cited

OTHER PUBLICATIONS

Ritala et al., "Atomic Layer Deposition", Handbook of Thin Films Materials, vol. 1, 2002, pp. 103-159.
U.S. Office Action mailed Oct. 6, 2005, from U.S. Appl. No. 10/975,028.
U.S. Office Action mailed Dec. 7, 2005, from U.S. Appl. No. 10/874,808.
U.S. Office Action mailed Feb. 24, 2006, from U.S. Appl. No. 11/077,108.
U.S. Office Action mailed Mar. 24, 2006, from U.S. Appl. No. 10/975,028.
PCT patent application No. PCT/US07/15979, International Search Report and Written Opinion dated Jan. 10, 2008.
U.S. Office Action mailed May 23, 2006, from U.S. Appl. No. 11/077,198.
U.S. Office Action mailed Jan. 30, 2007, from U.S. Appl. No. 10/890,376.
U.S. Office Action mailed May 14, 2008, from U.S. Appl. No. 11/519,445.
U.S. Office Action mailed Dec. 10, 2008, from U.S. Appl. No. 11/519,445.
U.S. Appl. No. 10/672,309, Notice of Allowance mailed Nov. 29, 2004.
U.S. Appl. No. 10/874,814, Notice of Allowance mailed Jun. 6, 2006.
U.S. Appl. No. 10/874,808, Notice of Allowance mailed May 18, 2006.
U.S. Appl. No. 11/077,198, Notice of Allowance mailed Sep. 8, 2006.
U.S. Appl. No. 11/077,108, Notice of Allowance mailed Jun. 14, 2006.
U.S. Appl. No. 11/542,723, Office Action mailed Sep. 18, 2009.
U.S. Appl. No. 11/542,723, Notice of Allowance mailed Feb. 9, 2010.
U.S. Appl. No. 11/542,723, Notice of Allowance mailed Apr. 8, 2010.
U.S. Appl. No. 11/626,328, Office Action mailed May 19, 2010.
U.S. Appl. No. 11/626,328, Office Action mailed Jan. 5, 2011.
U.S. Appl. No. 11/542,959, Office Action mailed Jul. 21, 2011.
U.S. Appl. No. 11/542,959, Office Action mailed Feb. 16, 2011.
U.S. Appl. No. 11/542,959, Office Action mailed Oct. 28, 2010.
U.S. Appl. No. 11/542,959, Office Action mailed Apr. 21, 2010.
US Notice of Allowance, dated Apr. 4, 2011, issued in U.S. Appl. No. 11/626,328.
US Office Action, dated Jul. 25, 2011, issued in U.S. Appl. No. 12/702,747.
US Office Action, dated Mar. 5, 2012, issued in U.S. Appl. No. 12/702,747.
US Final Office Action, dated Sep. 6, 2012, issued in U.S. Appl. No. 12/702,747.
US Office Action, dated Jun. 11, 2013, issued in U.S. Appl. No. 12/702,747.
US Final Office Action, dated Dec. 27, 2013, issued in U.S. Appl. No. 12/702,747.
US Office Action, dated Dec. 19, 2014, issued in U.S. Appl. No. 12/702,747.
PCT International Preliminary Report on Patentability and Written Opinion dated Apr. 7, 2009, issued in PCT/US2007/015979.

* cited by examiner

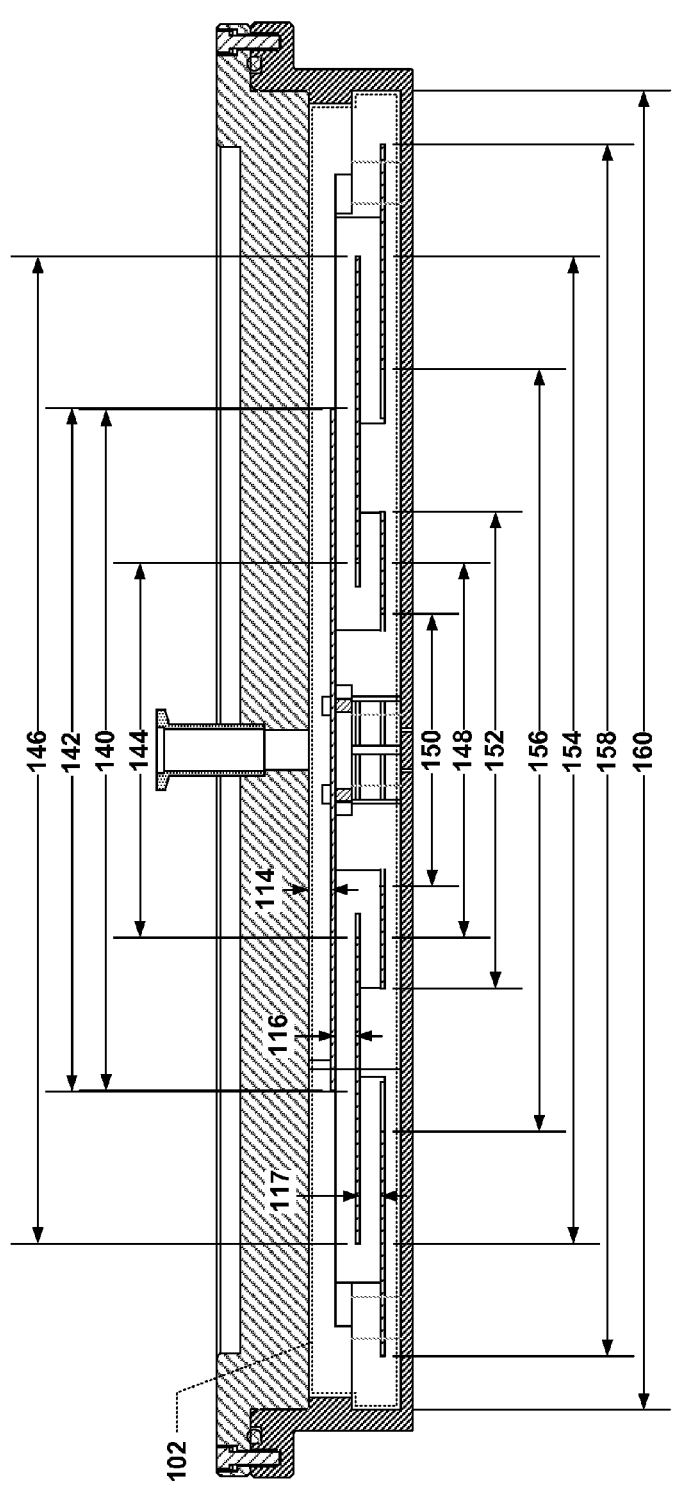
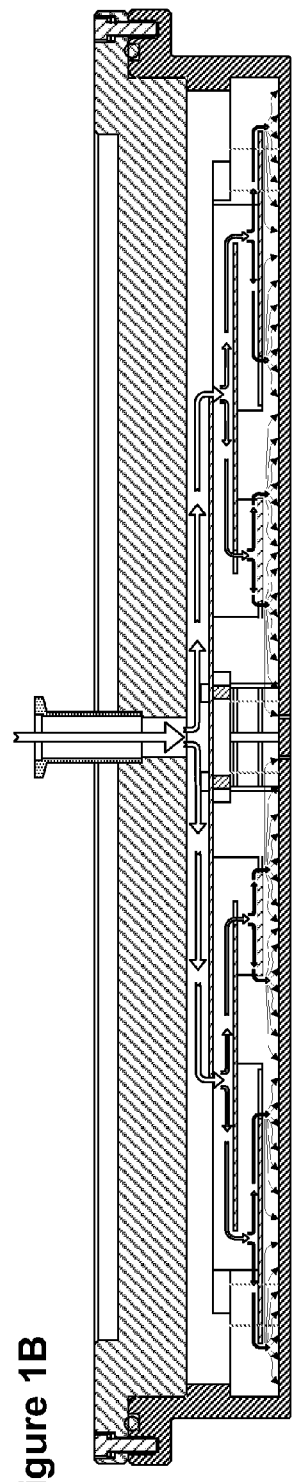
Figure 1B
Figure 1C

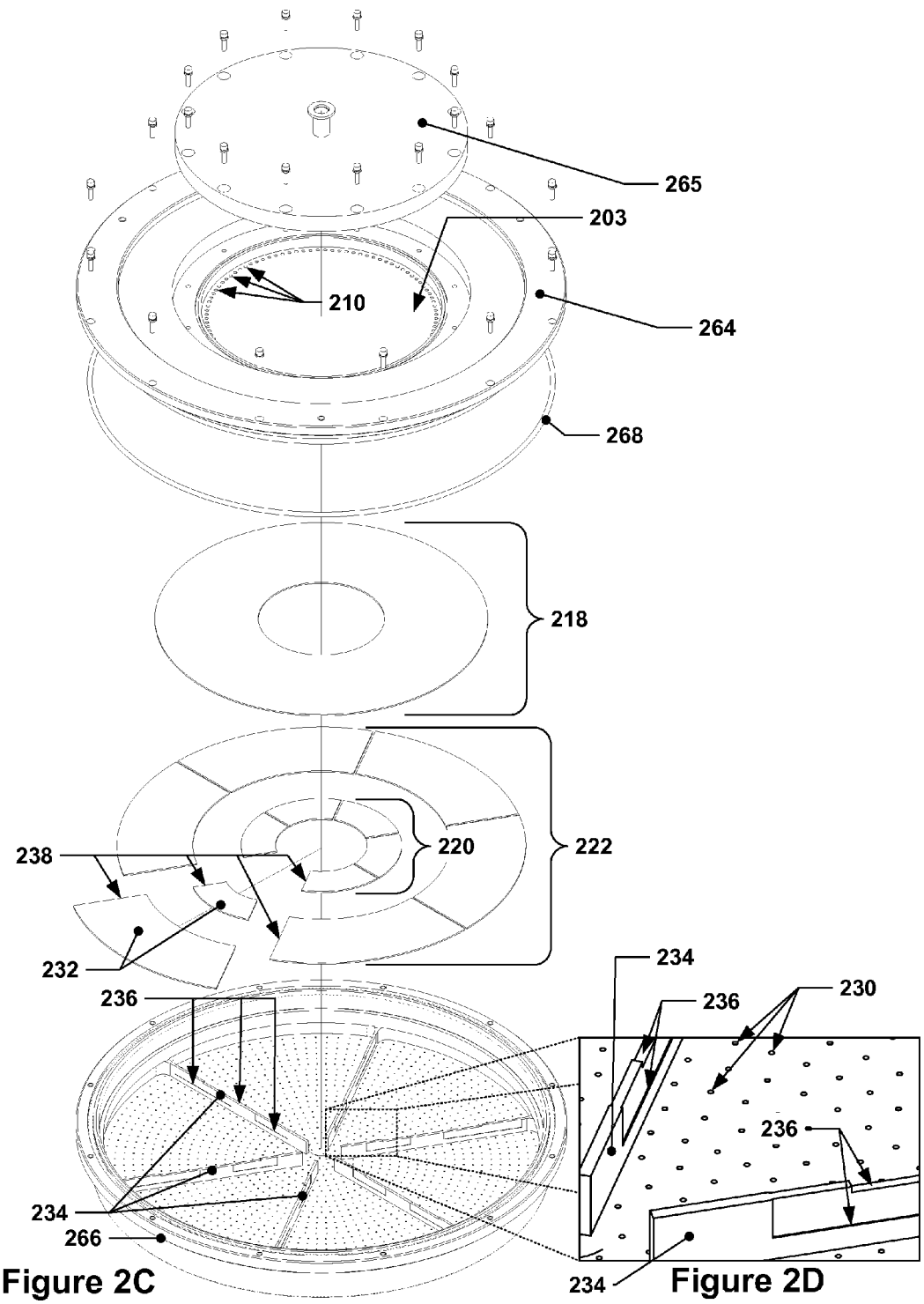

CASCADE DESIGN SHOWERHEAD FOR TRANSIENT UNIFORMITY

BACKGROUND OF THE INVENTION

Semiconductor processing tools often include components designed to distribute process gases in a relatively even manner across a semiconductor substrate or wafer. Such components are commonly referred to in the industry as "showerheads." Showerheads typically include a faceplate that fronts a plenum volume of some sort. The faceplate may include a plurality of through-holes that allow gas in the plenum volume to flow through the faceplate and into a reaction space between the substrate and the faceplate (or between a wafer support supporting the wafer and the faceplate). The through-holes are typically arranged such that the gas distribution across the wafer results in substantially uniform wafer processing.

SUMMARY OF THE INVENTION

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale unless specifically indicated as being scaled drawings.

In some implementations, an apparatus for distributing gas across a semiconductor wafer may be provided. The apparatus may include a plenum volume having a first surface and a second surface facing the first surface. The first surface and the second surface may at least partially define the plenum volume. The apparatus may also include one or more gas inlets into the plenum volume through the first surface and a first annular baffle. The first annular baffle may be substantially centered on the one or more gas inlets and may be substantially parallel to the first surface. The first annular baffle may be located between the first surface and the second surface.

In some further implementations of the apparatus, the apparatus may further include a circular baffle. The circular baffle may be substantially centered on the one or more gas inlets, substantially parallel to the first surface, and offset from the first surface by a first distance. The first annular baffle may be offset from the circular baffle by a second distance, and the circular baffle may be between the first annular baffle and the first surface.

In some further implementations of the apparatus, the circular baffle may have a diameter, the first annular baffle may have a mid-diameter, and the mid-diameter of the first annular baffle may be substantially equal to the diameter of the circular baffle. In some such implementations, the mid-diameter of the first annular baffle may be within 10% of the diameter of the circular baffle.

In some further implementations of the apparatus, the apparatus may further include one or more circumferential surfaces spanning between the first surface and the second surface. One of the one or more circumferential surfaces may have a diameter, and the first annular baffle may have an outer diameter. The diameter of the circular baffle may be substantially half the diameter of the circumferential surface and the outer diameter of the first annular baffle may be substantially equal to half of the sum of the diameters of the circumferential surface and the circular baffle.

In some further implementations of the apparatus, the apparatus may further include a second annular baffle and a third annular baffle. The second annular baffle and the third annular baffle may both be substantially centered on the one or more gas inlets, substantially parallel to the first surface, and offset from the first annular baffle by a third distance. The second annular baffle and the third annular baffle may be located between the first annular baffle and the second surface, and the first annular baffle may be between the circular baffle and the second annular baffle and between the circular baffle and the third annular baffle.

In some such implementations, the circular baffle and the first surface may be separated by a gap of approximately 0.3", the circular baffle and the first annular baffle may be separated by a gap of approximately 0.3", the first annular baffle and the second annular baffle may be separated by a gap of approximately 0.3", and the first annular baffle and the third annular baffle may be separated by a gap of approximately 0.3".

In some further implementations of the apparatus, the second annular baffle and the third annular baffle may be substantially co-planar with one another.

In some further implementations, the first annular baffle may have an inner diameter and an outer diameter and the second annular baffle and the third annular baffle may have mid-diameters. The mid-diameter of the second annular baffle may be substantially equal to the inner diameter of the first annular baffle and the mid-diameter of the third annular baffle may be substantially equal to the outer diameter of the first annular baffle.

In some such implementations, the mid-diameter of the second annular baffle may be within 10% of the inner diameter of the first annular baffle and the mid-diameter of the third annular baffle may be within 10% of the outer diameter of the first annular baffle.

In some further implementations of the apparatus, the second surface may be defined by a first side of a faceplate with a pattern of through-holes fluidly connecting the plenum volume with a second side of the faceplate opposite the first side.

In some further implementations of the apparatus, the first annular baffle, and/or other annular baffles in the apparatus (if any), may be formed by a plurality of arc-shaped baffle segments that form an annular shape when arranged in a circle. In some such implementations, the apparatus may further include a plurality of walls, each wall substantially perpendicular to the first surface and interposed between adjoining arc-shaped baffle segments of the first annular baffle. In some further such implementations, each wall may have at least one ledge that is configured to support adjoining edges of the arc-shaped baffle segments. In some such implementations, the apparatus may also include one or more circumferential surfaces spanning between the first surface and the second surface, and each wall may be a substantially radial wall substantially extending from the one or more circumferential surfaces towards the one or more gas inlets and spanning at least between the second surface and the first annular baffle.

In some further implementations of the apparatus, the apparatus may also include a backplate that provides the first surface. In such implementations, the one or more gas inlets may be arranged to distribute gas onto the first annular baffle.

In some further implementations of the apparatus, the apparatus may further include a second annular baffle and a third annular baffle. The second annular baffle and the third annular baffle may both be substantially centered on the one or more gas inlets, substantially parallel to the first surface, and offset from the first annular baffle by a second distance. The second annular baffle and the third annular baffle may be located between the first annular baffle and the second surface, and the first annular baffle may be between the first surface and the second annular baffle and between the first surface and the third annular baffle. In some such implementations, the second annular baffle and the third annular baffle may be substantially co-planar with one another.

In some such implementations, the first annular baffle may have an inner diameter and an outer diameter, and the second annular baffle and the third annular baffle may have mid-diameters. The mid-diameter of the second annular baffle may be substantially equal to the inner diameter of the first annular baffle and the mid-diameter of the third annular baffle may be substantially equal to the outer diameter of the first annular baffle. In some such implementations, the mid-diameter of the second annular baffle may be within 10% of the inner diameter of the first annular baffle and the mid-diameter of the third annular baffle may be within 10% of the outer diameter of the first annular baffle.

In some implementations of the apparatus, the apparatus may include one or more annular baffle layers, a first annular baffle layer of which may be formed by the first annular baffle. The annular baffle layers may be spaced apart from one another in a direction substantially normal to the annular baffle layers. Each annular baffle layer may include one or more annular baffles, and each annular baffle may be substantially centered on the one or more gas inlets. Each annular baffle layer may have twice as many annular baffles in it than the proximate annular baffle layer between that annular baffle layer and the first surface. Each annular baffle may have a mid-diameter, an outer diameter, and an inner diameter, and, for each annular baffle layer other than the first annular baffle layer, the mid-diameter of each annular baffle in that annular baffle layer may be substantially equal to a different one of the inner diameter or diameters and outer diameter or diameters of the annular baffle or annular baffles in the proximate annular baffle layer between that annular baffle layer and the first surface.

In some such implementations, for each annular baffle layer other than the first annular baffle layer, the mid-diameter of each annular baffle in that annular baffle layer may be within 10% of the different one of the inner diameter or diameters and the outer diameter or diameters of the annular baffle or annular baffles in the proximate annular baffle layer between that annular baffle layer and the first surface.

In some other implementations of the apparatus, each of the annular baffle layers may be spaced apart from any proximate annular baffle layers by at least 0.05".

In some implementations of the apparatus, one or more of the annular baffles may be formed from a plurality of arc-shaped baffle segments arranged in a substantially annular shape. In such implementations, the apparatus may further include a plurality of walls that are positioned between adjoining arc-shaped baffle segments of the annular baffles and configured to support the arc-shaped baffle segments within the plenum volume.

In some implementations, a semiconductor processing station may include such an apparatus as described above. In some further implementations, a semiconductor processing tool may include such a semiconductor processing station. In some implementations, the semiconductor processing tool may include a stepper.

While various implementations have been described herein, it should be understood that they have been presented by way of example only, and not limitation. Thus, the breadth and scope of the present disclosure should not be limited by any of the implementations described herein, but should be defined only in accordance with the following and later-submitted claims and their equivalents.

The following serve as nonlimiting examples of commercially-available semiconductor processing tools in which the implementations discussed herein may be employed: VECTOR®, ALTUS®, INOVA®, GAMMA®, G3D®, G400®, GxT®, Kiyo®, Versys®, Excelan® and Flex™ family of products available from Lam Research, Inc. (Fremont, Califorinia); Centura™, Endure™ and Producer™ family of products available from Applied Materials, Inc. (Santa Clara, Califorinia); Triase⁺™, Telius™, Tactras™ and UNITY™ family of products from Tokyo Electron Limited (Tokyo, Japan); and the Aspen™, SUPREMA™, Nexion™ and Alpine® family of products from Mattson Technology, Inc. (Fremont, Calif.).

BRIEF DESCRIPTION OF THE DRAWINGS

FIG. 1B depicts a side section view of the example cascade showerhead from FIG. 1A.

FIG. 1C depicts the side section view of the example cascade showerhead from FIG. 1B with arrows showing nominal gas flow directions within the showerhead.

FIG. 2C depicts an isometric exploded view of the example cascade showerhead of FIG. 2A.

FIG. 2D depicts a detail view of the portion of FIG. 2C indicated by a dotted rectangle.

FIGS. 1A through 1E and 2A through 2D are drawn to scale.

DETAILED DESCRIPTION

Figure 1A:
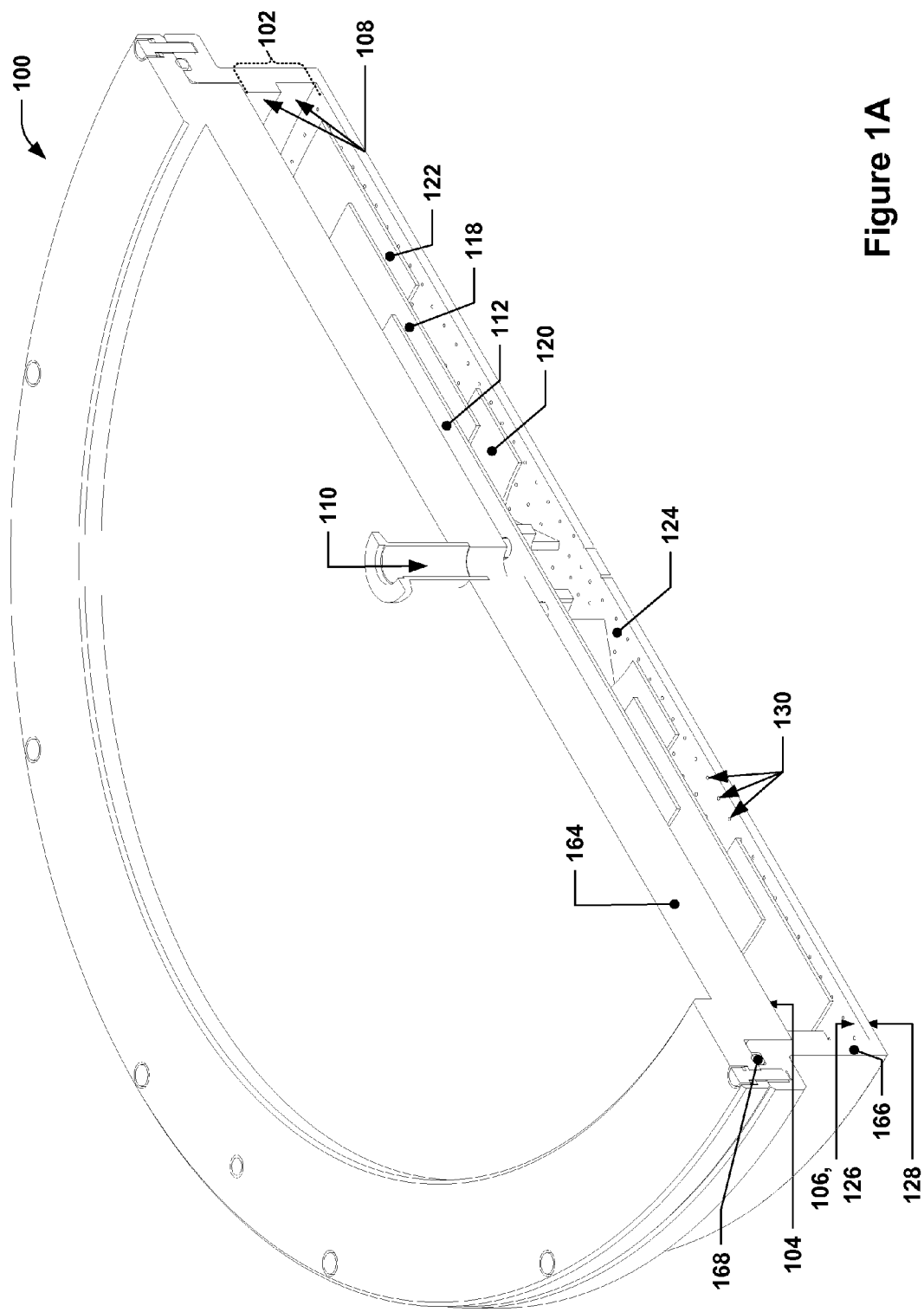
FIG. 1A depicts an isometric section view of an example of an implementation of a cascade showerhead.

Examples of various implementations are illustrated in the accompanying drawings and described further below. It will be understood that the discussion herein is not intended to limit the claims to the specific implementations described. On the contrary, it is intended to cover alternatives, modifications, and equivalents as may be included within the spirit and scope of the invention as defined by the appended claims. In the following description, numerous implementation-specific details are set forth in order to provide a thorough understanding of the present invention. The present invention may be practiced without some or all of these implementation-specific details. In other instances, well-known process operations have not been described in detail in order not to unnecessarily obscure the present invention.

Described herein are various implementations of showerheads featuring cascading internal baffle arrangements. Conventional showerhead designs may utilize a single, circular baffle plate positioned in front of a central gas inlet and within the showerhead plenum volume to prevent gas introduced into the showerhead plenum from jetting into the faceplate and thus producing a strong mass flow bias towards the center of the faceplate during both transient and steady-state flow.

By contrast, disclosed herein are showerheads featuring a plurality of annular baffles arranged in a multi-layered, cascading configuration within the showerhead plenum volume. Such cascade showerheads provide superior gas delivery uniformity across a wafer processed using such showerheads when compared to traditional, single-baffle showerheads, especially during transient flow conditions. For many conventional semiconductor fabrication processes, gas flow through a showerhead may occur for prolonged periods of time, and while such gas flows experience transient conditions during flow ramp-up and ramp-down, the bulk of such gas flows are at steady-state conditions. Under steady-state flow conditions, gas flow distribution out of the plenum and through the faceplate should be, and is typically, dominated primarily by the geometry of the hole pattern in the faceplate.

The present inventors have realized that providing a cascade baffle arrangement within a showerhead may greatly improve gas delivery uniformity across the faceplate of the showerhead during transient flow conditions. The present inventors have also realized that such improved transient-flow gas distribution may be of particular interest in processes with short cycle times, such as atomic layer deposition (ALD) processes, where gas flows through the showerhead may be pulsed for short intervals. In such pulsed flows, transient flow conditions may dominate over steady-state flow conditions or steady-state flow conditions may never be achieved.

It is to be understood that the present inventors have also realized that cascade showerheads, as discussed herein, may also be of use in longer-flow processes where steady state conditions may dominate. For example, any initial variation in mass delivery as a function of radial position that occurs during transient flow conditions may cause the deposition during subsequent steady-state flow conditions to be skewed despite substantially uniform gas delivery across the wafer during steady-state flow conditions, e.g., causing center-heavy deposition in the overall process. Another possibility is that any initial transient mass delivery non-uniformity may result in an initial film germination with substantial non-uniform features. These non-uniform features may then be propagated through the overall film thickness when subsequent material is added. Thus, even in processes with long flow times that are dominated by steady-state flow conditions, cascade showerheads may still be used to counteract non-uniformities that may be introduced during the transient-flow portions of such processes.

FIG. 1A depicts an isometric section view of an example of an implementation of a cascade showerhead. As can be seen in FIG. 1A, a showerhead 100 is depicted that features a backplate 164 and a showerhead body 166; the showerhead body 166 may include a faceplate 124 featuring a pattern of through-holes 130 that communicate between a first side 126 and a second side 128 of the faceplate 124. A first surface 104, e.g., such as provided by the backplate 164, and a second surface 106, e.g., such as provided by the first side 126 of the faceplate 124, may, in conjunction with a circumferential surface or surfaces 108, e.g., such as provided by an inner surface or surfaces of the showerhead body 166, substantially define a plenum volume 102 (see FIG. 1B for further indication of the plenum volume 102). The plenum volume 102 may be supplied with a process gas, e.g., a reactant or purge gas, via a gas inlet or inlets 110. The gas inlet(s) 110 may be substantially centered on the hole pattern of through holes 130 and may be connected to a process gas supply or supplies.

A number of baffle structures may be included in the plenum volume 102 to provide a cascading baffle arrangement. Reference also may be made below to distances and dimensions that are indicated in FIG. 1B, which depicts a side section view of the example cascade showerhead from FIG. 1A. These baffle structures may include a circular baffle 112 that is positioned in front of, and substantially centered on, the gas inlet 110. The circular baffle 112 may be offset from the first surface 104 by a first distance 114 (see FIG. 1B). A first annular baffle 118 may be positioned below the circular baffle 112 and substantially centered on the circular baffle 112; the first annular baffle 118 may be offset from the circular baffle 112 by a second distance 116.

In the pictured implementation, a second annular baffle 120 and a third annular baffle 122 are also depicted. The second annular baffle 120 and the third annular baffle 122 may be co-planar with one another and offset from the first annular baffle 118 by a third distance 117.

The circular baffle 112 may have a diameter 140, and each annular baffle may be generally described as having an outer diameter, an inner diameter, and a mid-diameter halfway between the outer diameter and the inner diameter. Thus, for example, the first annular baffle 118 may have an outer diameter 146, an inner diameter 144, and a mid-diameter 142; the second annular baffle 120 may have an outer diameter 152, an inner diameter 150, and a mid-diameter 148; and the third annular baffle 122 may have an outer diameter 158, an inner diameter 156, and a mid-diameter 154. Additionally, the circumferential surface 108 may have a diameter 160; in cases where the circumferential surface has multiple actual diameters, the diameter 160 may refer to the outermost such diameter.

As can be seen in FIGS. 1A and 1B, each annular baffle is sized such that its mid-diameter is substantially equal to either the outer diameter or inner diameter of the annular baffle above it (or, in the case of the first annular baffle, such that the mid-diameter 142 is substantially equal to the diameter 140). In some implementations, the mid-diameters of the annular baffles may not be exactly equal to the outer diameter, inner diameter, or diameter of the baffle above, but may be substantially equal, e.g., within 10% of such values.

With respect to the implementation shown in FIG. 1A, the diameter 140 may be 10", the outer diameter 146 may be 14.5", the inner diameter 144 may be 5.5", the outer diameter 152 may be 7", the inner diameter 150 may be 4", the outer diameter 158 may be 18", and the inner diameter 156 may be 11". Accordingly the mid-diameter 142 may be 10", the mid-diameter 148 may be 5.5", and the mid-diameter 154 may be 14.5". In the implementation shown, the diameter 160 may be 20". Other implementations may feature annular baffles, circular baffles, and circumferential surfaces with other dimensions and aspect ratios.

The first distance 114, the second distance 116, and the third distance 117 may be sized such that flow resistance due to such distances between neighboring and overlapping baffles does not contribute significantly to overall flow resistance of the baffle stack. Such distances also may, for example, be sized to be substantially equal to one another so that any flow resistance effects that are generated due to such distances are similar in magnitude between baffle pairs. In the implementation shown, for example, the first distance 114, the second distance 116, and the third distance 117 are 0.3". In other implementations, however, the inter-baffle spacing may be different, e.g., so as to tune the flow resistances in the baffle overlap areas. In some implementations, these distances may be limited by the plenum volume 102. For example, in retrofit situations, e.g., where the showerhead must be compatible with pre-existing equipment that limits the overall thickness of the showerhead, there may be an upper limit on these distances. This upper limit may decrease depending on the number of annular baffle layers that are used. In some implementations, the inter-baffle spacing may be set to a value larger than 0.05". In some other implementations, the inter-baffle spacing may be set to a value larger than 0.2".

FIG. 1C depicts the side section view of the example cascade showerhead from FIG. 1B with arrows showing nominal gas flow directions within the showerhead. As can be seen in this simplified representation, as gas flows over an edge of a baffle and onto the baffle below the edge, a portion of the gas flows radially outwards, and the remaining portion of the gas flows radially inwards. At each such transition, the gas flow is further subdivided, resulting in a more uniform gas distribution at the faceplate 124, i.e., gas reaches various radial locations at the top of the faceplate at nearly equal times.

Figures 1D, 1E:
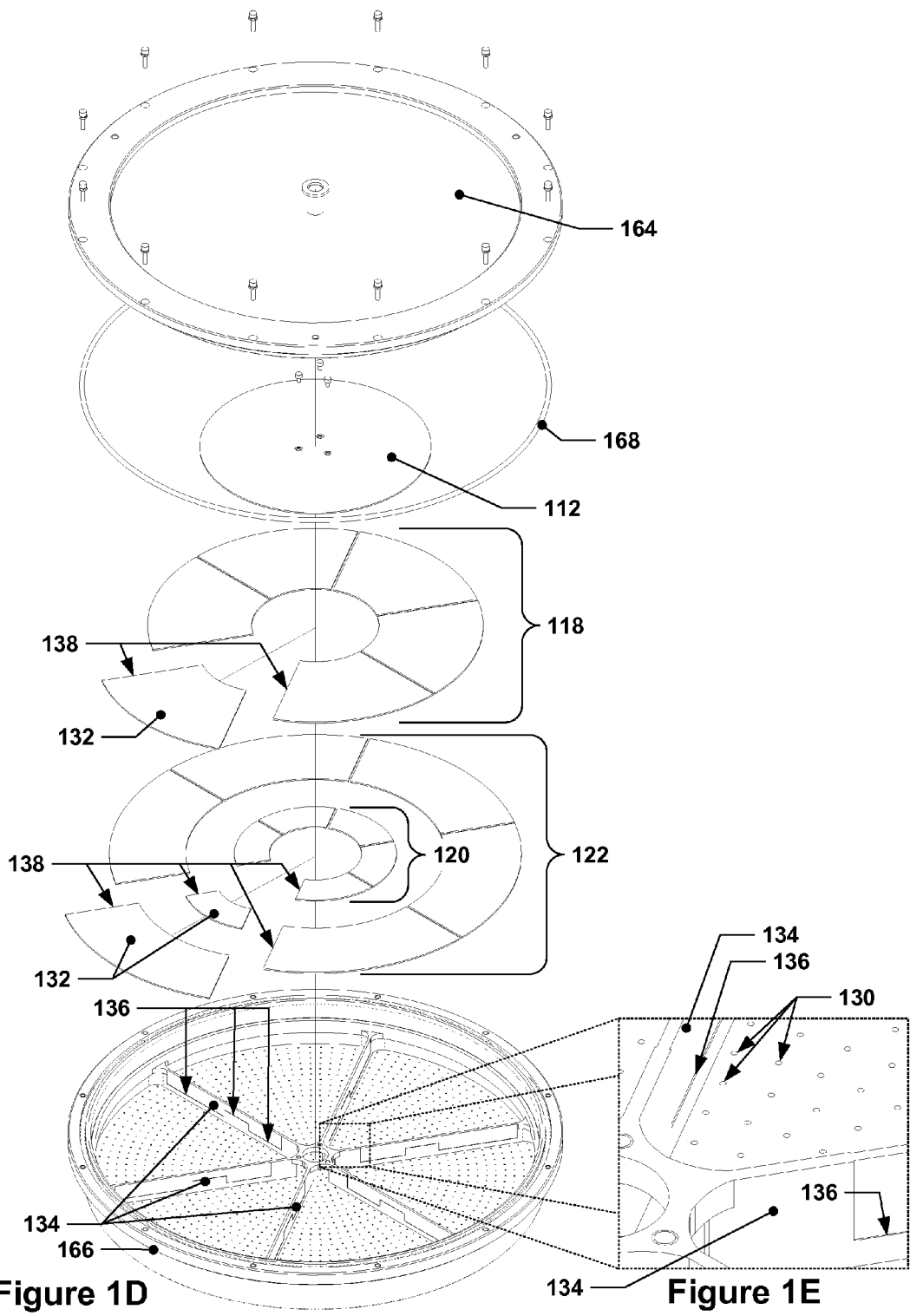
FIG. 1D depicts an isometric exploded view of the example cascade showerhead of FIG. 1A.
FIG. 1E depicts a detail view of the portion of FIG. 1D indicated by a dotted rectangle.

FIG. 1D depicts an isometric exploded view of the example cascade showerhead of FIG. 1A. Various internal features of the showerhead 100 may be seen in more detail in this view. The backplate 164 is shown, as is a seal 168 that may be used to provide a hermetic seal between the backplate 164 and the showerhead body 166. A plurality of screws or other fasteners may be used to clamp the backplate 164 to the showerhead body 166. In other implementations, such an assembly may be replaced by a welded or bonded assembly. The backplate 164 and the showerhead body 166 may be made from a variety of materials compatible with a semiconductor processing environment, e.g., aluminum alloy, ceramics, etc. The backplate 164 and the showerhead body 166 need not be made from the same material.

Visible in FIG. 1D is the circular baffle 112 which, in this implementation, is fastened to a support structure in the showerhead body 166 via three mounting screws. Also visible in FIG. 1D are the first annular baffle 118, the second annular baffle 120, and the third annular baffle 122. In this implementation, each such annular baffle is formed by arranging a plurality of arc-shaped baffle segments 132 in a circular pattern. The baffle segments 132 may be arranged such that their adjoining edges 138 are separated by a small gap. Each baffle segment 132 may be supported by ledges 136 in walls 134 that are interposed between adjoining edges 138. FIG. 1E depicts a detail view of the portion of FIG. 1D indicated by a dotted rectangle; the ledges 136 and through-holes 130 in the faceplate 124 may be more clearly visible in the detail view.

The ledges 136 may be provided at different heights in the walls 134 to allow the annular baffles to be located at different offsets from each other, if needed. The baffle segments 132 may be brazed, bonded, or otherwise held in place with respect to the overall assembly to prevent the baffle segments 132 from sliding free of the ledges 136.

It is to be understood that reference to an "annular baffle" in this disclosure encompasses not only "pure" annular structures, e.g., unbroken annular shapes, but also annular structures that are built up from multiple non-annular, smaller structures, e.g., the baffle segments 132. It is also to be understood that the annular baffles and circular baffles described herein may also include other features, e.g., mounting holes, that do not detract from their annularity or circularity. For example, instead of supporting each annular baffle with an array of walls 134, a plurality of standoffs, screws, and through-holes in the baffles may be used to space the baffles apart from one another in a configuration similar to that discussed above.

It is to be understood that some implementations of a cascade showerhead may forgo a circular baffle within the plenum volume. For example, rather than a centrally-located gas inlet or inlets, a cascade showerhead may introduce process gas into the plenum volume via a circular pattern of gas inlets that are located in an annular zone corresponding to the mid-diameter of the first annular baffle.

Figure 2A:
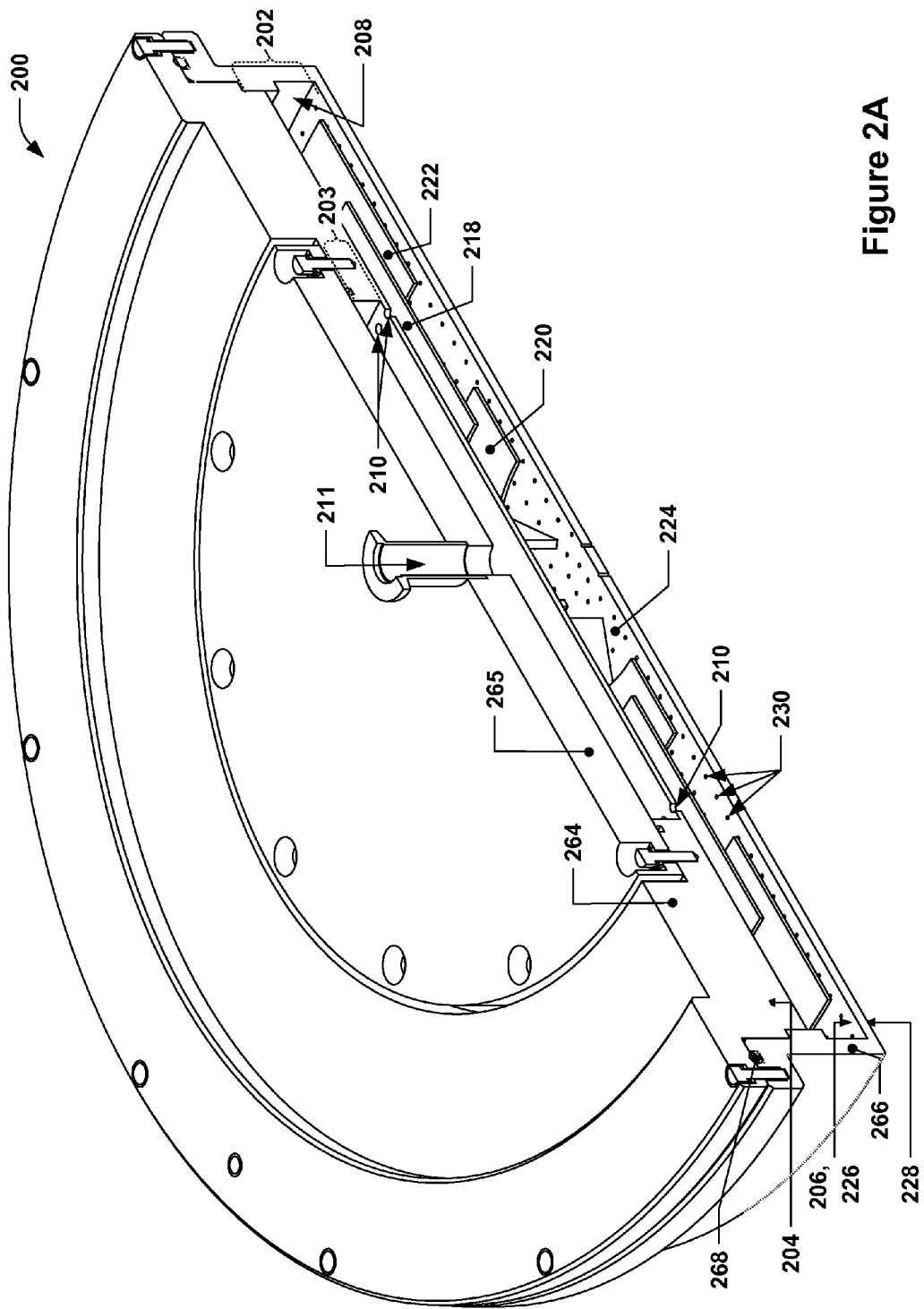
FIG. 2A depicts an isometric section view of an example of another implementation of a cascade showerhead.

FIG. 2A depicts an isometric section view of an example of an implementation of a cascade showerhead without a circular baffle. Depicted in FIG. 2A is a showerhead 200 that is similar in many respects to the showerhead 100 of FIG. 1A. For example, the showerhead 200 includes a first annular baffle 218, a second annular baffle 220, and a third annular baffle 222 arranged in substantially the same manner as the first annular baffle 118, the second annular baffle 120, and the third annular baffle 122 of FIG. 1A. A faceplate 224 with through-holes 230 connecting a first side 226 and a second side 228 is depicted as well. The faceplate 224 may form part of a showerhead body 266, which may be connected with a backplate 264. A seal 268 may be interposed between the showerhead body 266 and the backplate 264. A plenum volume 202 (see FIG. 2B for further indication of the plenum volume 202) may be defined by a first surface 204, e.g., provided by the backplate 264, a second surface 206, e.g., provided by the faceplate 224, and a circumferential surface or surfaces 208.

Notably absent in FIG. 2A is a circular baffle, e.g., such as the circular baffle 112 of FIG. 1A. Instead, the backplate 264 may include a recessed area capped by an end cap 265. The recessed area may form a second plenum volume 203 that is fluidly connected with the plenum volume 202 via a circular pattern of gas inlets 210. The second plenum volume 203 may be fed by a central gas feed or feeds 211. Gas that is flowed into the second plenum volume 203 may flow from the second plenum volume 203 and through the gas inlets 210 into the plenum volume 202 in a substantially evenly-distributed manner due to the radial symmetry provided by the circular pattern of gas inlets 210. The gas inlets 210 may be positioned so as to lie above the mid-diameter of the first annular baffle 218. Thus, the second plenum volume 203 and circular pattern of gas inlets 210 may serve a similar function as the circular baffle 112 of FIG. 1A. In effect, the portion of the backplate 264 that separates the second plenum volume 203 from the plenum volume 202 may act in a manner similar to a circular baffle, although instead of being located within the plenum volume, this portion acts as part of the boundary of the plenum volume 202. It is to be understood that the second plenum volume and circular pattern of gas inlets may be provided using geometries other than that shown in FIGS. 2A through 2D.

Figure 2B:
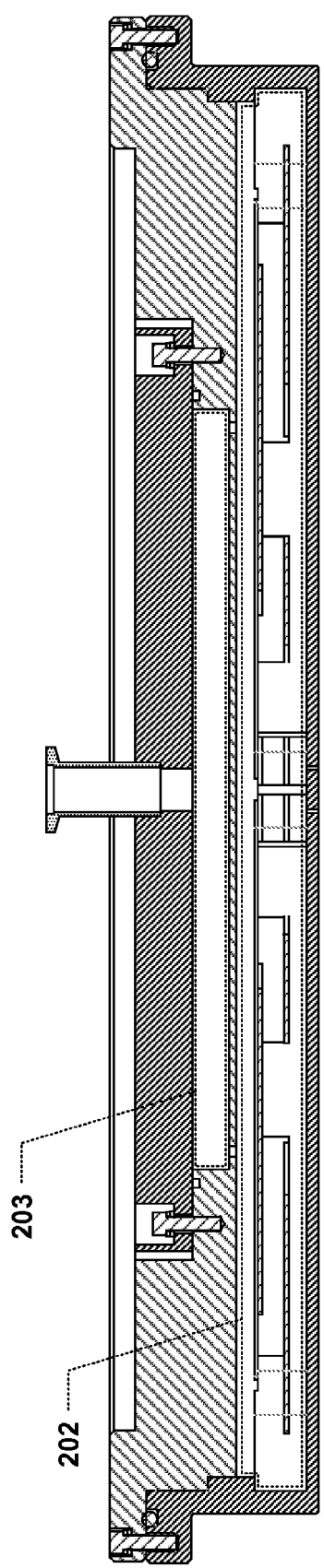
FIG. 2B depicts a side section view of the example cascade showerhead from FIG. 2A.

FIG. 2B depicts a side section view of the example cascade showerhead from FIG. 2A. This view may more clearly show the second plenum volume 203 and the plenum volume 202.

FIG. 2C depicts an isometric exploded view of the example cascade showerhead of FIG. 2A. As can be seen, this implementation also features a continuous first annular baffle 218 rather than a piecemeal first annular baffle, such as is depicted in FIG. 1D. As is perhaps more apparent from FIG. 2D, which depicts a detail view of the portion of FIG. 2C indicated by a dotted rectangle, the use of a continuous first annular baffle 218 may allow for a different support structure configuration. For example, the first annular baffle 218 may rest in recessed ledges 236 along the top surface of walls 234, whereas baffle segments 232 may be supported along edges 238 by ledges 236 in the sides of the walls 234.

Thus, cascade arrangements of annular baffles may be used with showerheads featuring a circular baffle as well as with showerheads that do not include a circular baffle but that do provide for gas inlets arrayed in a substantially circular fashion at the mid-diameter of the first annular baffle.

As mentioned earlier in this disclosure, cascade showerheads such as those described in this disclosure may provide for greatly improved performance over conventional showerheads featuring a single, circular baffle and no cascading arrangement of annular baffles.

Figure 3A:
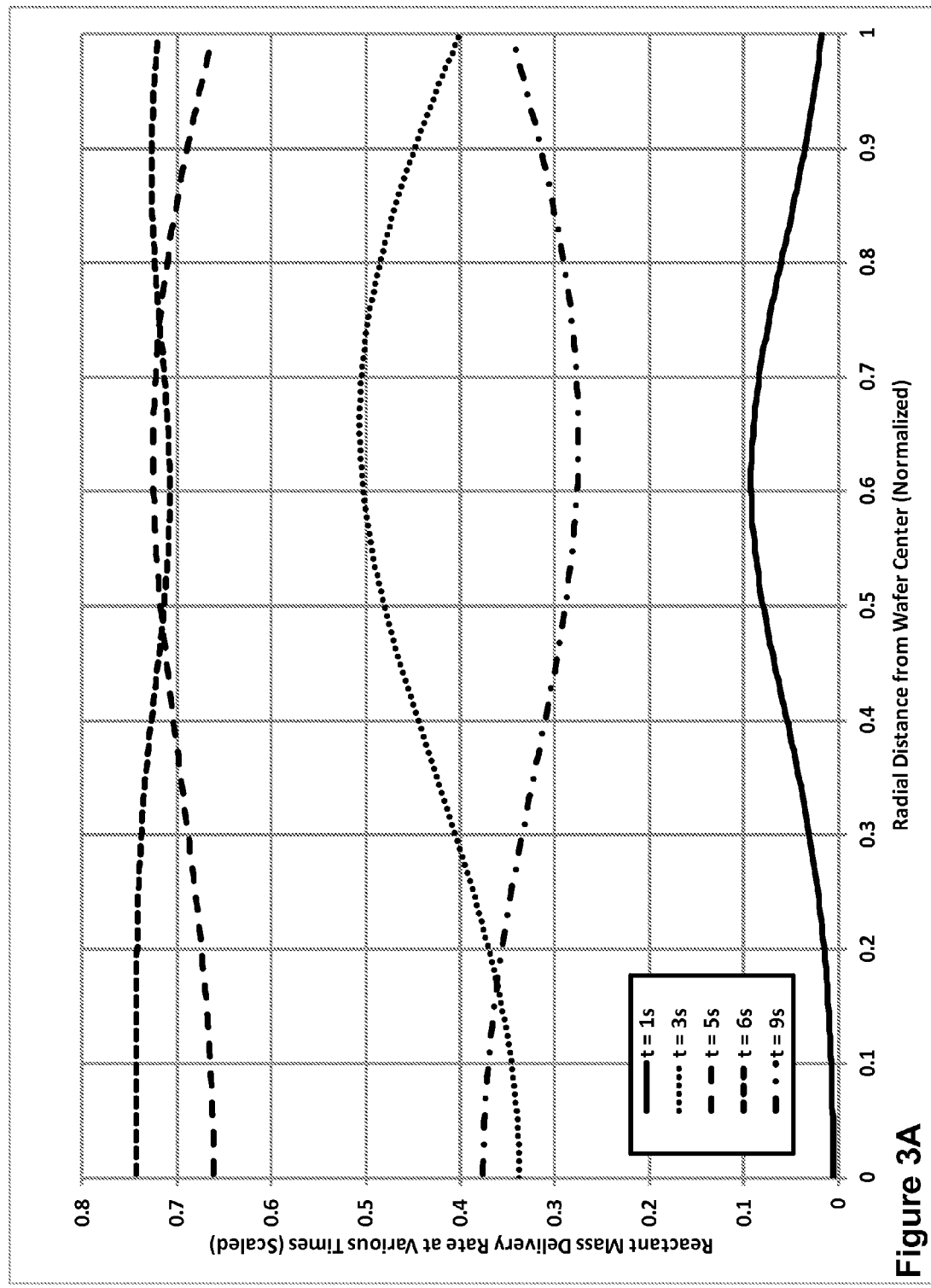
FIG. 3A depicts a graph showing reactant mass delivery rate to a wafer at various times as a function of distance from wafer center for an example showerhead with a single, circular baffle.
Figure 3B:
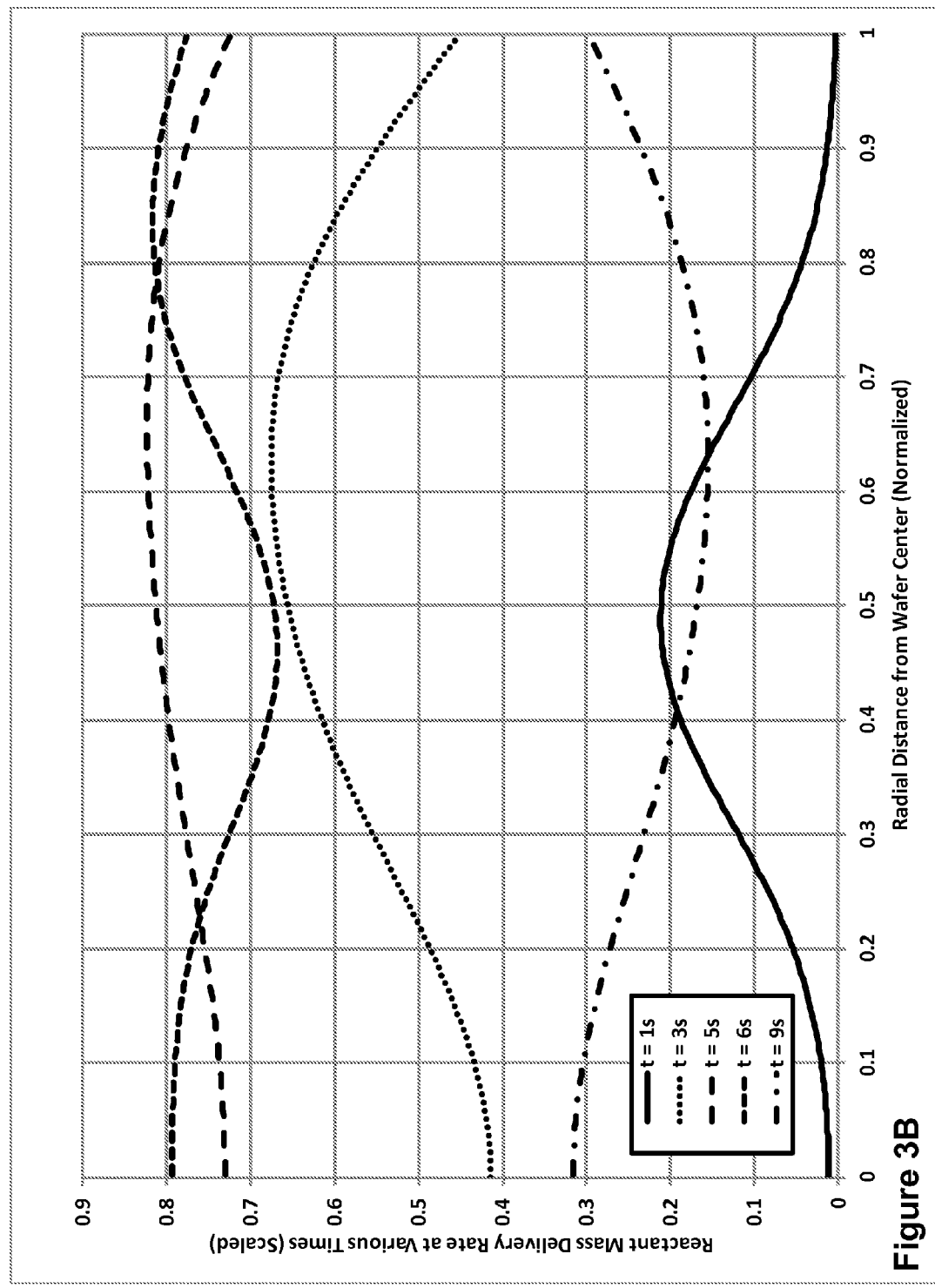
FIG. 3B depicts a graph showing reactant mass delivery rate to a wafer at various times as a function of distance from wafer center for an example showerhead with a single, circular baffle that is designed for use with wafers approximately 50% larger than the wafers for which the example showerhead of FIG. 3A is designed.
Figure 3C:
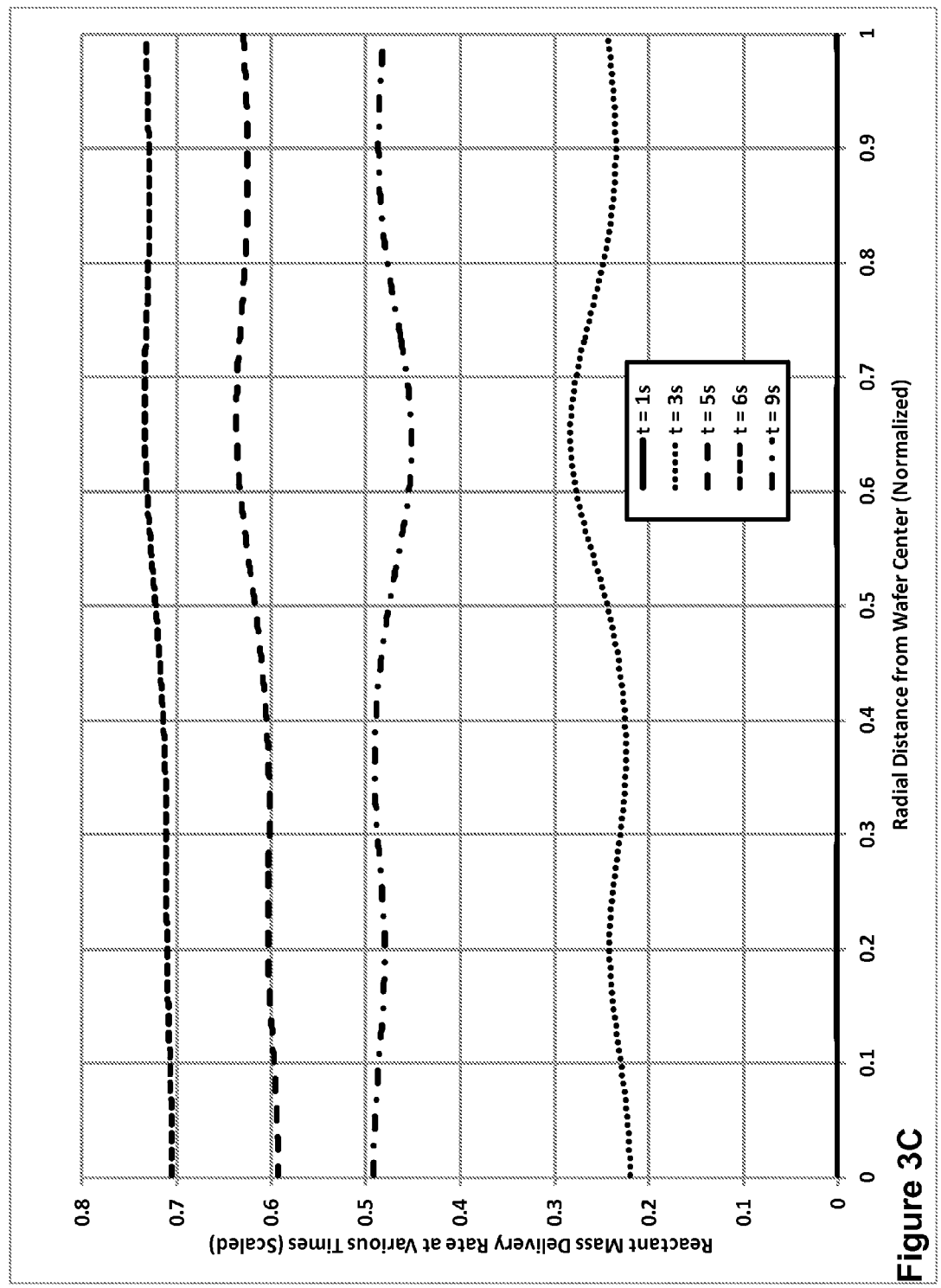
FIG. 3C depicts a graph showing reactant mass delivery rate to a wafer at various times as a function of distance from wafer center for an example showerhead with a cascade showerhead design.
Figure 3D:
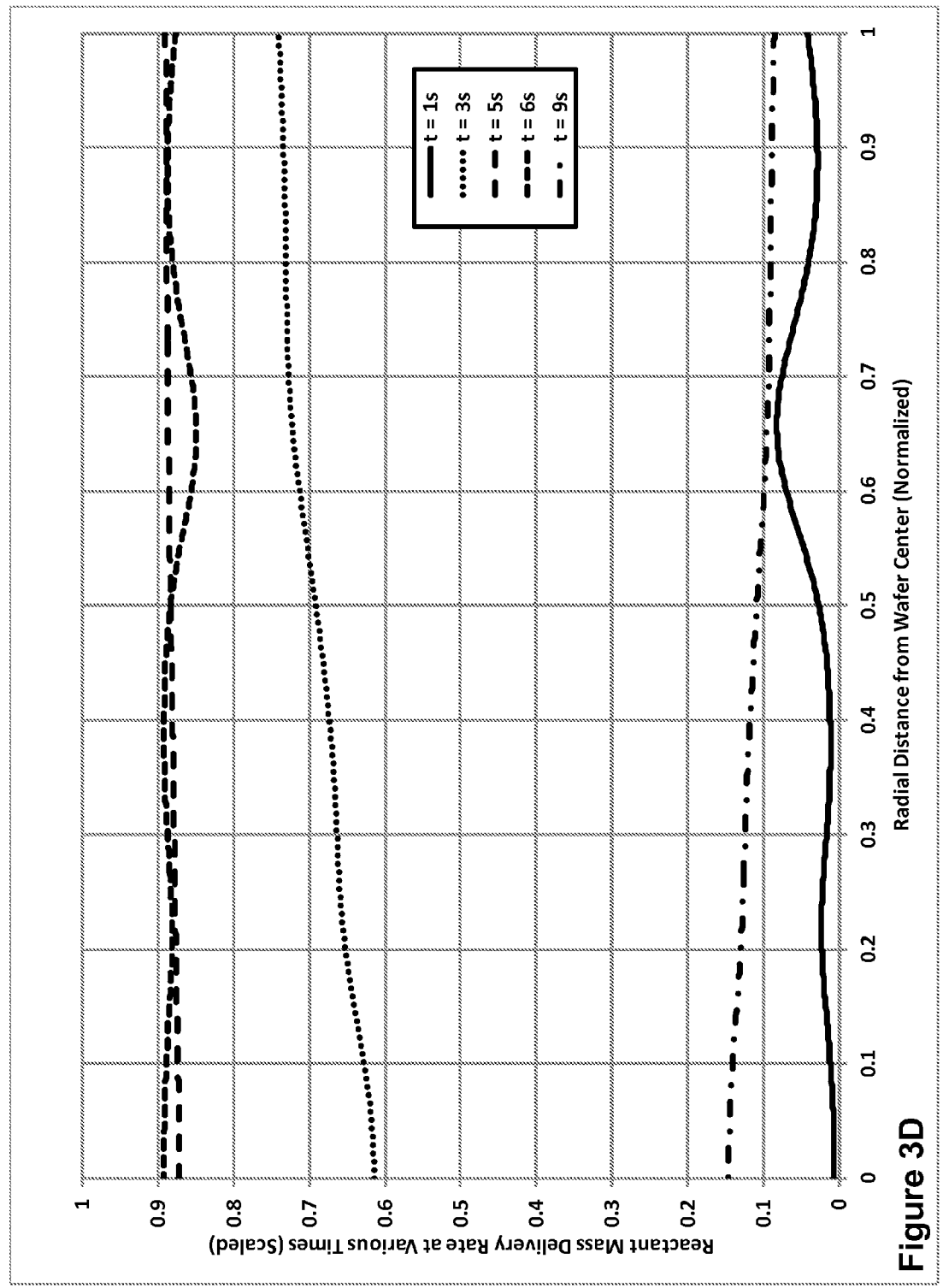
FIG. 3D depicts a graph showing reactant mass delivery rate to a wafer at various times as a function of distance from wafer center for the example cascade showerhead of FIG. 3C with 2 times the flow rate of the flow rate of FIG. 3C.

FIGS. 3A through 3D depict various graphs that demonstrate the differences in performance between cascade showerhead designs as discussed herein and more conventional showerheads, e.g., single-baffle, circular plate showerheads. FIG. 3A depicts a graph showing reactant mass delivery rate to a wafer at various times as a function of distance from wafer center for an example showerhead with a single, circular baffle. FIG. 3B depicts a graph showing reactant mass delivery rate to a wafer at various times as a function of distance from wafer center for an example showerhead with a single, circular baffle that is designed for use with wafers approximately 50% larger in diameter than the wafers for which the example showerhead of FIG. 3A is designed. FIG. 3C depicts a graph showing reactant mass delivery rate to a wafer at various times as a function of distance from wafer center for an example showerhead with a cascade showerhead design. FIG. 3D depicts a graph showing reactant mass delivery rate to a wafer at various times as a function of distance from wafer center for the example cascade showerhead of FIG. 3C with 2 times the flow rate of the flow rate of FIG. 3C. FIGS. 3A through 3D have all been scaled in the Y-axis by the same amount. The gas flows represented by FIGS. 3A through 3D all include 5 s of reactant flow followed by 5 s of purge gas flow, although the plots only show the amount of reactant mass that is delivered to the wafer. The gas flow rates represented in FIGS. 3B and 3C are approximately 2.25 times the gas flow rate represented in FIG. 3A, whereas the gas flow rate represented in FIG. 3D is approximately twice that represented in FIG. 3C.

With reference to FIGS. 3A and 3B, it can be seen that there is considerable variation in the rate of reactant mass-delivery across the surface of a wafer by the showerheads represented in FIGS. 3A and 3B. As noted above, the showerheads represented by FIGS. 3A and 3B both feature a single, circular baffle plate within the plenum volume and do not include a cascade arrangement of annular baffles within the plenum volume. Furthermore, the variation in center-to-edge mass-delivery rate across the wafer increases as the showerhead of FIG. 3A is increased to accommodate an increase in diameter of the wafer by 50% and the flow rate is increased to 2.25× that of FIG. 3A to arrive at the showerhead represented in FIG. 3B. This mass-delivery rate variation is exhibited during both transient flow (t=1 s) and during more developed flow (t=9 s). It is to be understood that the decrease in reactant mass-delivery rate at t=9 s is due to the fact that the reactant flow into the showerhead is stopped at t=5 s and that the residual reactant in the plenum volume is then bled off in continuously-decreasing amounts during the subsequent purge gas flow.

By contrast, with reference to FIGS. 3C and 3D, it can be seen that utilizing a cascade showerhead, e.g., similar to the cascade showerhead of FIG. 1A, for gas delivery may greatly reduce the variation in mass-delivery rate of the process gas to the wafer with respect to radial position. It is to be understood that FIGS. 3B, 3C, and 3D represent scenarios with identical wafer sizes, i.e., 50% larger in diameter than the wafer size represented in FIG. 3A. As can be seen, the peak-to-trough variation in mass-delivery rate across the wafer at t=1 s in FIG. 3C is less than 50% of the variation in mass-delivery rate across the wafer at t=1 s in FIG. 3B. Furthermore, such decreases in mass-delivery rate variation are exhibited by the cascade showerhead implementations of FIGS. 3C and 3D at all five instances in time that are plotted. Due to the increased uniformity of mass delivery rate across the wafer with the larger wafer size, cascade showerheads may be particularly well-suited for use in newer, 450 mm wafer processes, although cascade showerheads as discussed herein may, of course, also be well-suited for use with processes for other sizes of wafer, both larger and smaller than 450 mm.

The cascade showerhead represented in FIG. 3C also demonstrates increased mass-delivery rate uniformity at higher flow rates. For example, FIG. 3D demonstrates the mass-delivery rate to the wafer as a function of distance from wafer center of the showerhead of FIG. 3C for a gas flow that is 2 times higher than that represented in FIG. 3C. As is evident, the mass-delivery rate to the wafer remains relatively uniform across the wafer diameter for all times with the cascade showerhead, as compared with the non-cascade, single circular baffle showerhead, even at increased flow conditions.

Figure 4A:
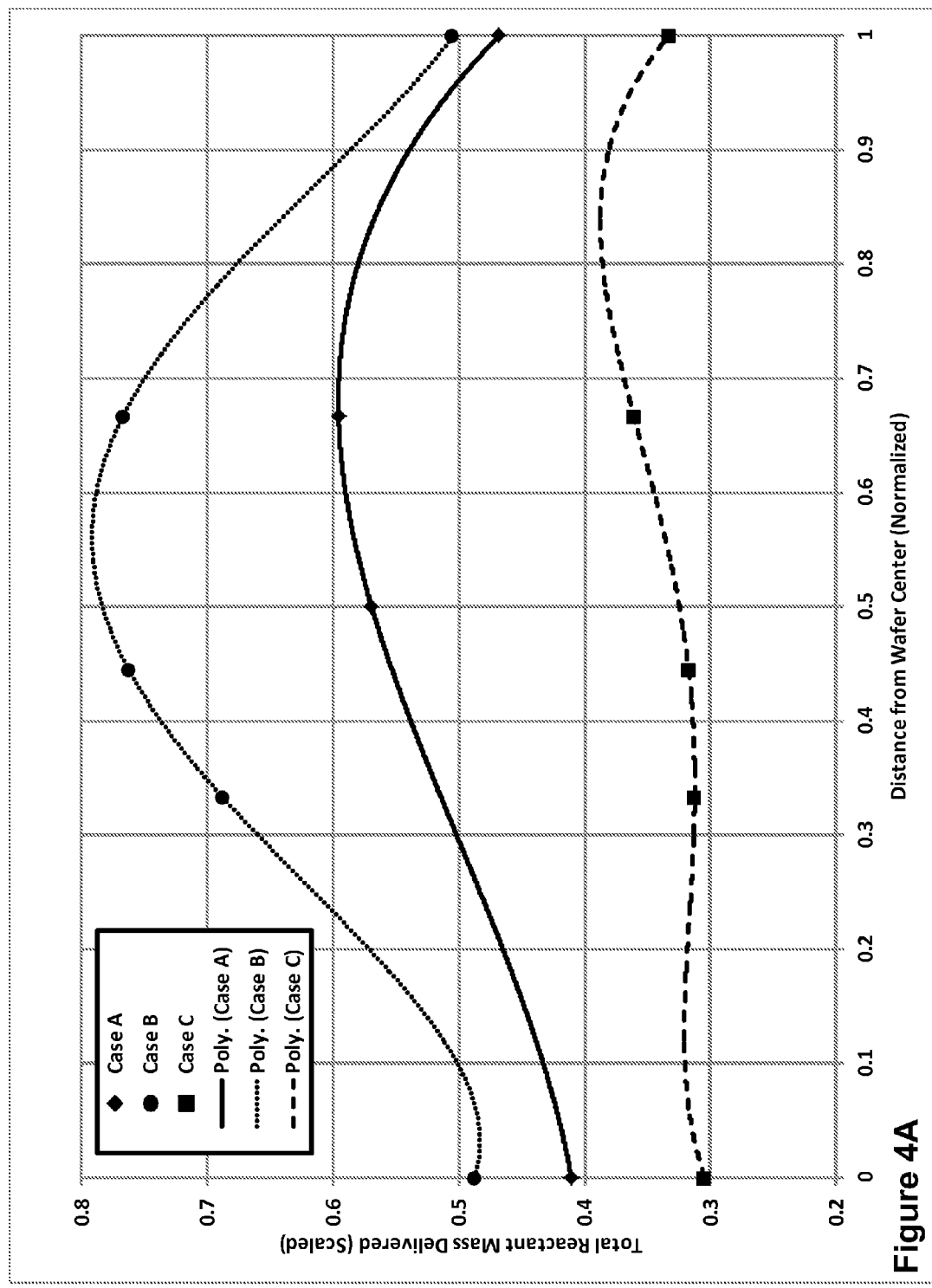
FIG. 4A depicts a graph showing the total reactant mass delivered to a wafer over a 5 second reactant flow for various showerhead types as a function of distance from wafer center.
Figure 4B:
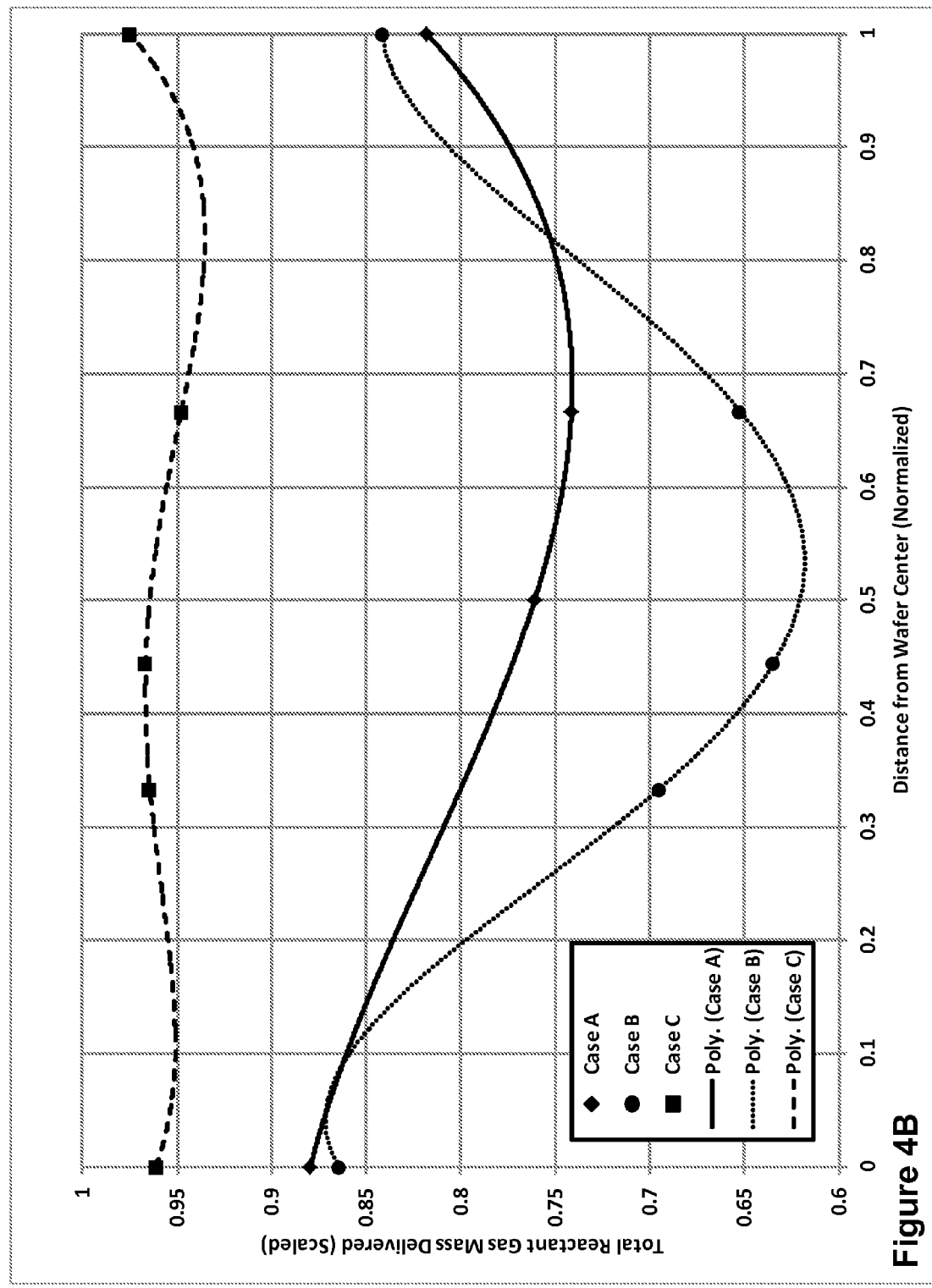
FIG. 4B depicts a graph showing the total reactant mass delivered to a wafer after a 5 second purge flow following the 5 second reactant flow of FIG. 4A for various showerhead types as a function of distance from wafer center.

FIG. 4A depicts a graph showing the total reactant mass delivered to a wafer after a 5 second reactant flow for various showerhead types as a function of distance from wafer center. FIG. 4B depicts a graph showing the total reactant mass delivered to a wafer after a 5 second purge flow following the 5 second reactant flow of FIG. 4A for various showerhead types as a function of distance from wafer center. It is to be understood that while FIG. 4B's mass-delivery values reflect the total mass delivery as a function of radial wafer position that occurs during a 5 s purge flow following a 5 s reactant flow, the total mass delivery shown for FIG. 4B does not include reactant mass delivered during the 5 s reactant flow of FIG. 4A.

Whereas FIGS. 3A through 3D represent instantaneous mass-delivery values as a function of wafer radial position, FIGS. 4A and 4B represent integrated mass-delivery values as a function of wafer radial position. Since integrated mass-delivery values may serve as a predictor of wafer feature uniformity, such plots may provide insight as to process uniformity between different types of showerheads.

In FIGS. 4A and 4B, three different data plots are shown (4-5 data points for each plot are provided, as well as a 4-th order polynomial fit for each data plot). Case A represents the integrated mass-delivery for the showerhead represented in FIG. 3A and case B represents the integrated mass-delivery for the showerhead represented in FIG. 3B, i.e., non-cascade showerheads. Case C represents the integrated mass-delivery for the showerhead represented in FIG. 3C, i.e., a cascade showerhead. As can be seen, the cross-wafer uniformity of the integrated mass-delivery for the cascade showerhead is nearly 3 times better than that exhibited by the non-cascade showerhead of FIG. 3A and nearly 5 to 6 times better than that exhibited by the non-cascade showerhead of FIG. 3B.

It is to be understood that while the examples shown in FIGS. 1A through 1E feature planar baffles, e.g., flat disks or rings, the circular baffle and annular baffles used in a cascade showerhead according to this disclosure may have non-planar cross-sections. For example, some or all of the circular baffle (if present) and/or annular baffles may have cross-sections with sloped or curved portions. Additionally, the circular baffle (if present) and/or annular baffles may not be completely impermeable to gas flow, i.e., a pattern of through-holes may be included in a circular baffle and/or annular baffle to allow some of the gas flowing across the baffle to pass through the baffle without necessarily flowing past the inner or outer edge of the annular baffle or the outer edge of the circular baffle. The amount of such through-baffle gas flow may be modulated through regulating the size, number, and positioning of such through-holes.

Figure 5:
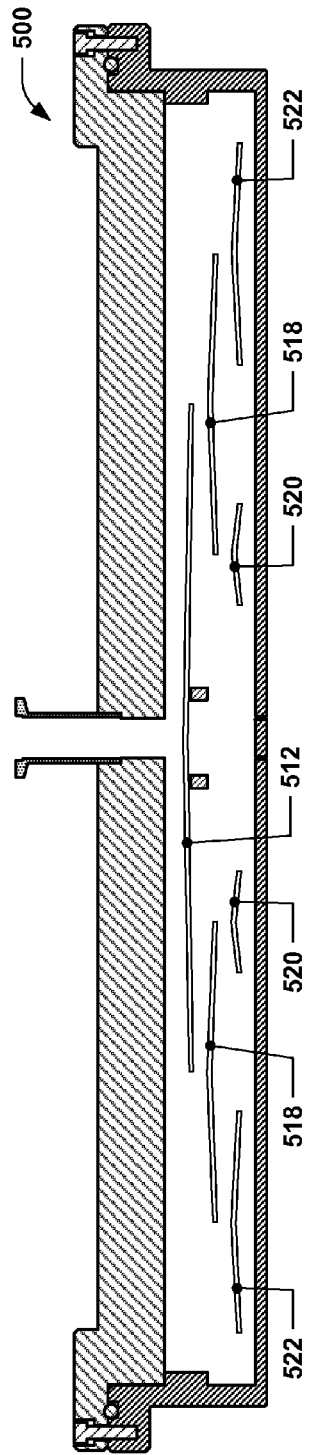
FIG. 5 depicts a conceptual side section view of an example of another implementation of a cascade showerhead.

FIG. 5 depicts a conceptual side section view of an example of another implementation of a cascade showerhead. In this implementation, a circular baffle 512 is provided that has a slight conical shape. A first annular baffle 518, a second annular baffle 520, and a third annular baffle 522 are provided where each annular baffle slopes downward toward the inner diameter and the outer diameter of that annular baffle from the mid-diameter of that annular baffle. Such circular baffles and annular baffles are not "planar" since they feature non-planar cross-sections. However, such circular baffles and annular baffles may still, for convenience, be referred to as if they were planar in nature. For example, the first annular baffle 518 may still generally be planar since the vertical thickness of the first annular baffle 518 is much less than the outer diameter of the first annular baffle 518. Additionally, because the annular baffles may be substantially axially symmetric, the annular baffles may be associated with reference planes that are perpendicular to the symmetry axes of the annular baffles. Thus, for example, when a non-planar baffle is said to be "parallel" to a surface, it is to be understood that such a reference may indicate that a reference plane perpendicular to a symmetry axis of the non-planar baffle is parallel to that surface.

It is to be further understood that a cascade showerhead may include more or fewer annular baffles than are shown in FIGS. 1A through 1E. For example, in some implementations, a cascade showerhead may include only one annular baffle. In some other implementations, a cascade showerhead may include six, fourteen, or more annular baffles. Generally speaking, the number N of annular baffles in a cascade showerhead correlates to a geometric series determined by the number n of annular baffle layers, where the geometric series has a sum determined by:

$$N = 2^n - 1$$

Figure 6:
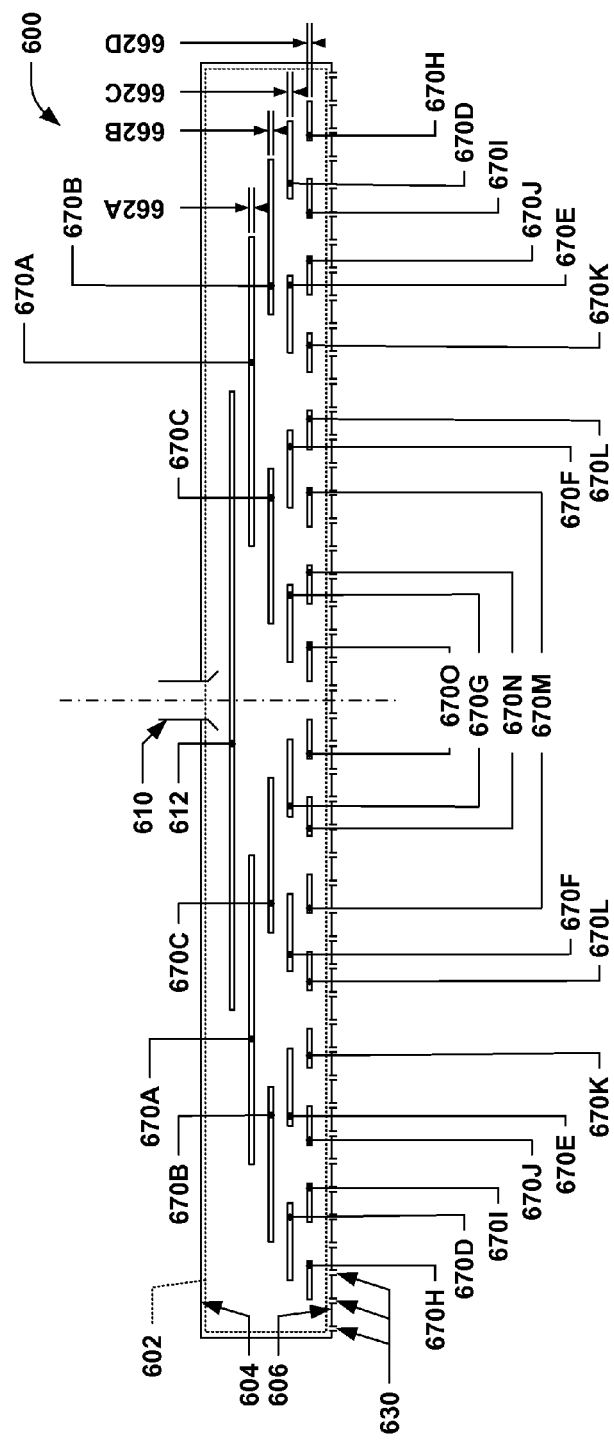
FIG. 6 depicts a conceptual side section view of an example of another implementation of a cascade showerhead.

FIG. 6 depicts a conceptual side section view of an example of another implementation of a cascade showerhead. In FIG. 6, a cascade showerhead 600 is depicted that has four annular baffle layers 662 (a circular baffle 612 is not included in an annular baffle layer in this convention, although alternative conventions may do so with appropriate modification of the above geometric series), each of which may have one or more annular baffles 670. Thus, a plenum volume 602 may include an annular baffle layer 662A with an annular baffle 670A; an annular baffle layer 662B with annular baffles 670B and 670C; an annular baffle layer 662C with annular baffles 670D, 670E, 670F, and 670G; and an annular baffle layer 662D with annular baffles 670H, 670I, 670J, 670K, 670L, 670M, 670N, and 670O. The plenum volume may be bounded by a first surface 604 and a second surface 606; the second surface 606 may be provided by a faceplate with a pattern of through-holes 630 fluidly connecting the plenum volume 602 with a wafer reaction space below the cascade showerhead 600. A gas inlet 610 may supply gas to the plenum volume 602.

In theory, an ideal cascade showerhead may include an infinite number of annular baffle layers, although, in practice, constraints such as packaging space, material thickness, and other factors may impose a practical limit on the number of annular baffle layers used. For example, the number of annular baffle layers, the thicknesses of the circular baffles and the annular baffles, and the thickness of the plenum volume may result in inter-baffle gaps that are small enough that the flow resistances across the baffles in regions of the baffles that overlap as compared with the flow resistances across the regions of the baffles where there is no such overlap may vary by an amount sufficient to cause unacceptable process non-uniformity downstream.

For example, if one assumes that the annular baffle layer(s) and the circular baffle all have the same thickness ($t_b$), that each annular or circular baffle is spaced apart from the surface above it by the same distance ($t_{offset}$), that the bottom-most annular baffle layer is spaced apart from the faceplate by $t_{bf\_offset}$, and that the plenum has a thickness of $t_p$, then the maximum number of annular baffle layers (L) (not including the circular baffle) that may still fit within these constraints may be easily determined by:

$$L = \left[\left[ \frac{t_p - t_{bf\_offset}}{t_b + t_{offset}} - 1 \right]\right] \text{ (Double brackets indicate floor function)}$$

This relationship may, of course, be modified depending on the specific design constraints used. For example, different thicknesses of baffle, different inter-baffle spacing, and other sources of variation may require that the above relationship be modified.

Figure 7:
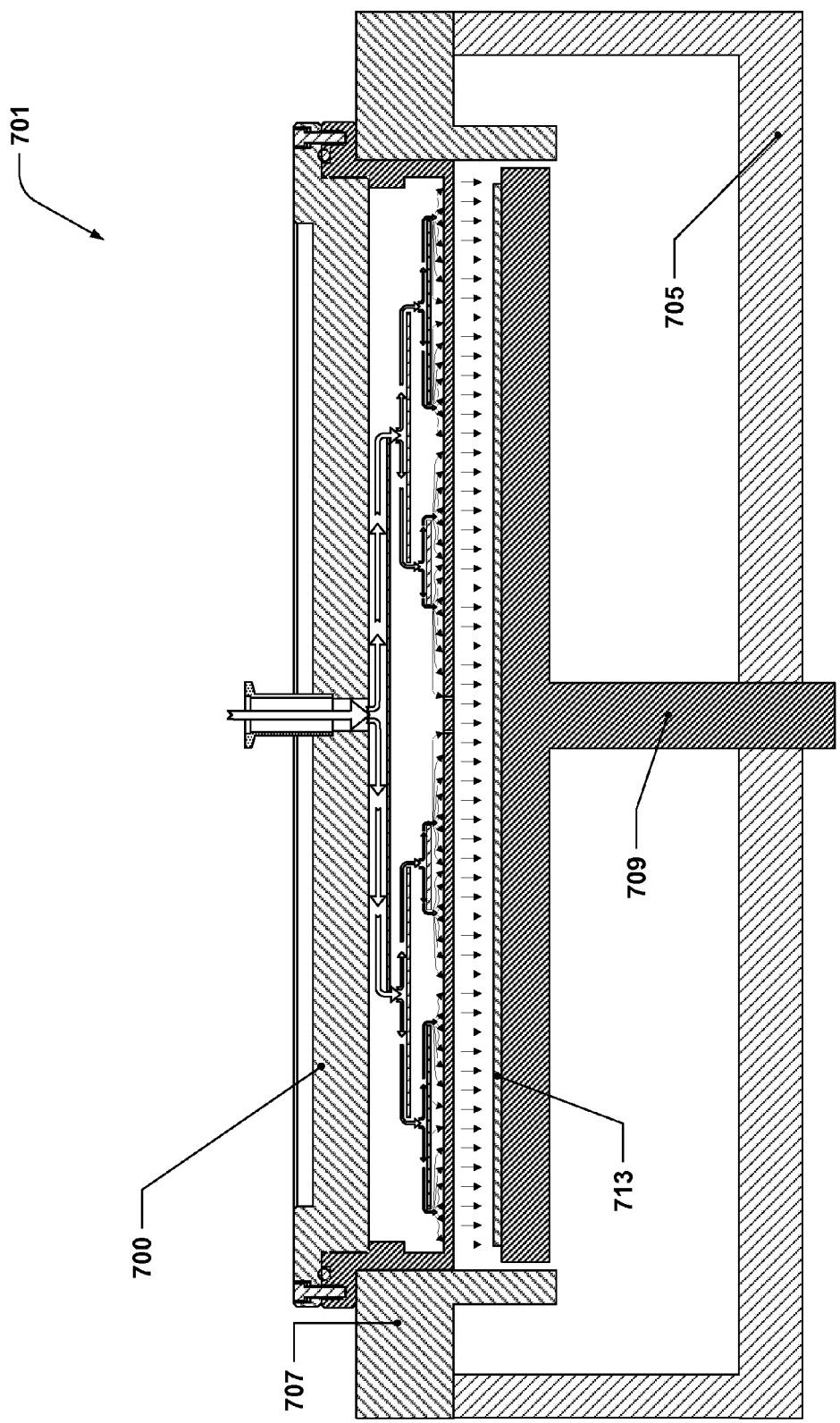
FIG. 7 depicts a conceptual side section view of a cascade showerhead installed in a semiconductor process chamber.

As mentioned previously, a cascade showerhead may be installed in a semiconductor process chamber; FIG. 7 depicts a conceptual side section view of a cascade showerhead installed in a semiconductor process chamber.

A process chamber 701 may include a cascade showerhead 700 that is mounted to the top of a chamber housing 705. In some implementations, an adapter plate 707 may be interposed between the cascade showerhead 700 and the chamber housing 705. A wafer support 709 may support a semiconductor wafer 713 within the process chamber 701 and beneath the cascade showerhead 700. A microvolume may be formed between the wafer support 709 and the cascade showerhead 700. The microvolume may serve as a wafer reaction area and may help concentrate and retain process gases in the vicinity of the semiconductor wafer 713 during processing. The wafer support 709 may be configured to move up and down to facilitate wafer load and unload operations. In other implementations, the cascade showerhead may be suspended from a lid (not shown) of the process chamber 701 by a stem and may not itself form part of the "lid" of the process chamber 701. In such implementations, the cascade showerhead 700 may be configured to move up and down to facilitate wafer load/unload.

In some implementations, one or more such process chambers may be provided as process stations in a multi-station semiconductor processing tool. In some implementations, a single process chamber may include multiple processing stations, some or all of which may have their own cascade showerhead assemblies.

Figure 8:
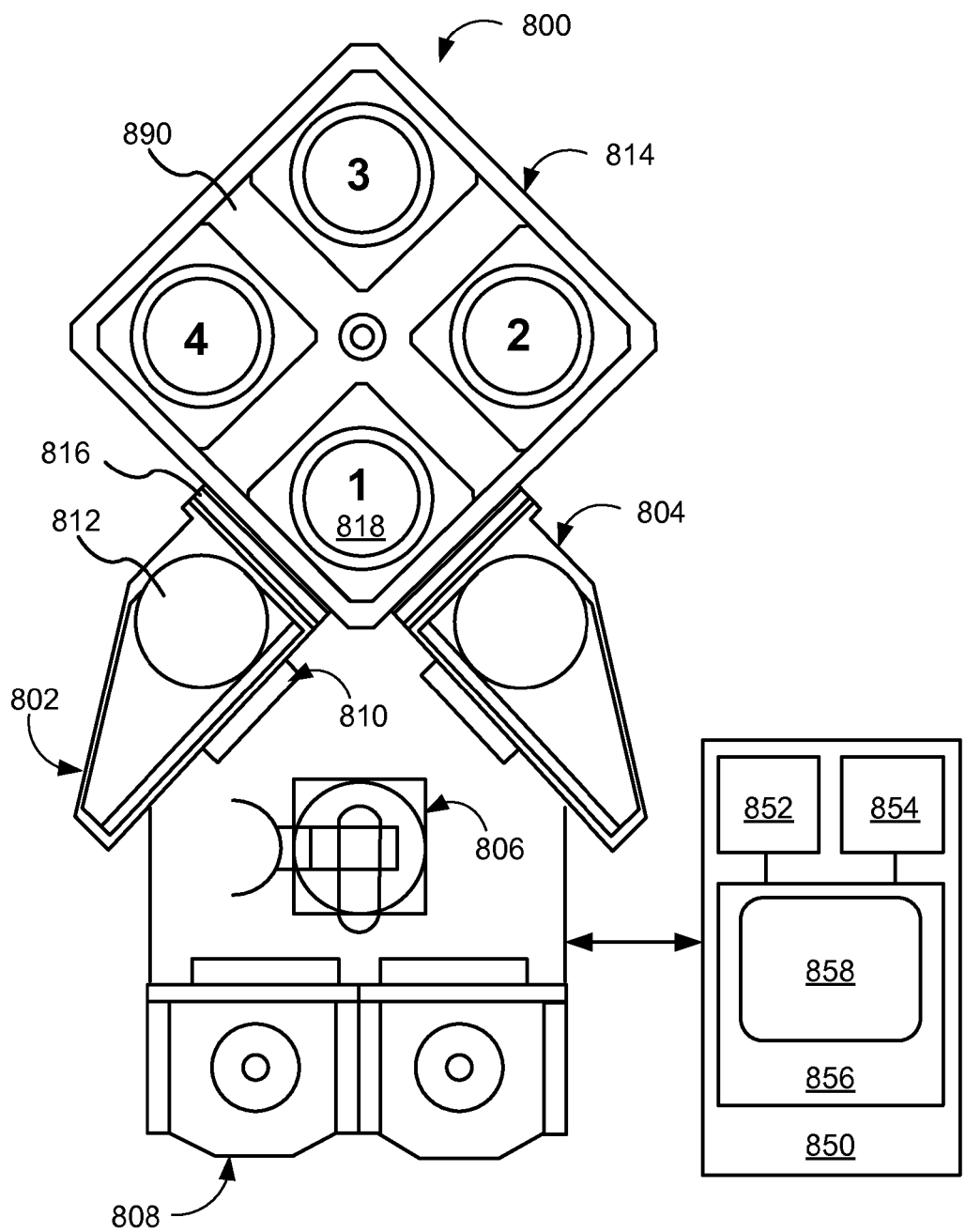
FIG. 8 shows a schematic view of a multi-station processing tool that may be used with a cascade showerhead.

FIG. 8 shows a schematic view of a multi-station processing tool, 800, with an inbound load lock 802 and an outbound load lock 804. A robot 806, at atmospheric pressure, is configured to move wafers from a cassette loaded through a pod 808 into inbound load lock 802 via an atmospheric port 810. A wafer may be placed by the robot 806 on a pedestal 812 in the inbound load lock 802, the atmospheric port 810 may be closed, and the load lock may then be pumped down. If the inbound load lock 802 includes a remote plasma source, the wafer may be exposed to a remote plasma treatment in the load lock prior to being introduced into a processing chamber 814. Further, the wafer also may be heated in the inbound load lock 802, for example, to remove moisture and adsorbed gases. Next, a chamber transport port 816 to processing chamber 814 may be opened, and another robot (not shown) may place the wafer into the processing chamber 814 on a pedestal of a first station shown in the reactor for processing. While the implementation depicted in FIG. 8 includes load locks, it will be appreciated that, in some implementations, direct entry of a wafer into a process station may be provided.

The depicted processing chamber 814 includes four process stations, numbered from 1 to 4 in the implementation shown in FIG. 8. Each station may have a heated or unheated pedestal (shown at 818 for station 1), and gas line inlets. It will be appreciated that in some implementations, each process station may have different or multiple purposes. For example, in some implementations, a process station may be switchable between an ALD and plasma-enhanced chemical vapor deposition (PECVD) process mode. Additionally or alternatively, in some implementations, processing chamber 814 may include one or more matched pairs of ALD and PECVD process stations. While the depicted processing chamber 814 comprises four stations, it will be understood that a processing chamber according to the present disclosure may have any suitable number of stations. For example, in some implementations, a processing chamber may have five or more stations, while in other implementations a processing chamber may have three or fewer stations.

Each station may include a separate showerhead assembly that delivers process gases to a wafer at the associated station. In some implementations, some or all of these showerheads may utilize a cascade showerhead as described herein. For example, if a station provides ALD processing, or other processing that may benefit from use of the equipment described herein, to a wafer, the showerhead for that station may be a cascade showerhead as discussed herein.

FIG. 8 also depicts a wafer handling system 890 for transferring wafers within processing chamber 814. In some implementations, wafer handling system 890 may transfer wafers between various process stations and/or between a process station and a load lock. It will be appreciated that any suitable wafer handling system may be employed. Non-limiting examples include wafer carousels and wafer handling robots. FIG. 8 also depicts a system controller 850 employed to control process conditions and hardware states of process tool 800. System controller 850 may include one or more memory devices 856, one or more mass storage devices 854, and one or more processors 852. Processor 852 may include a CPU or computer, analog and/or digital input/output connections, stepper motor controller boards, etc.

In some implementations, system controller 850 controls all of the activities of process tool 800. System controller 850 executes system control software 858 stored in mass storage device 854, loaded into memory device 856, and executed on processor 852. System control software 858 may include instructions for controlling the timing, mixture of gases, chamber and/or station pressure, chamber and/or station temperature, wafer temperature, target power levels, RF power levels, substrate pedestal, chuck and/or susceptor position, and other parameters of a particular process performed by process tool 800. System control software 858 may be configured in any suitable way. For example, various process tool component subroutines or control objects may be written to control operation of the process tool components necessary to carry out various process tool processes. System control software 858 may be coded in any suitable computer readable programming language.

In some implementations, system control software 858 may include input/output control (IOC) sequencing instructions for controlling the various parameters described above. For example, each phase of an ALD process may include one or more instructions for execution by system controller 850. The instructions for setting process conditions for an ALD process phase may be included in a corresponding ALD recipe phase. In some implementations, multiple showerheads, if present, may be controlled independently to allow for separate, parallel process operations to be performed.

Other computer software and/or programs stored on mass storage device 854 and/or memory device 856 associated with system controller 850 may be employed in some implementations. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 818 and to control the spacing between the substrate and other parts of process tool 800.

A process gas control program may include code for controlling gas composition and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station or a gas flow into the process station.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations. The plasma control program may, in appropriate situations, include code for controlling an external plasma generator and/or valving required to supply process gas to a plasma generator or radical source volume.

In some implementations, there may be a user interface associated with system controller 850. The user interface may include a display screen, graphical software displays of the apparatus and/or process conditions, and user input devices such as pointing devices, keyboards, touch screens, microphones, etc.

In some implementations, parameters adjusted by system controller 850 may relate to process conditions. Non-limiting examples include process gas composition and flow rates, temperature, pressure, plasma conditions (such as RF bias power levels), pressure, temperature, etc. These parameters may be provided to the user in the form of a recipe, which may be entered utilizing the user interface.

Signals for monitoring the process may be provided by analog and/or digital input connections of system controller 850 from various process tool sensors. The signals for controlling the process may be output on the analog and digital output connections of process tool 800. Non-limiting examples of process tool sensors that may be monitored include mass flow controllers, pressure sensors (such as manometers), thermocouples, etc. Appropriately-programmed feedback and control algorithms may be used with data from these sensors to maintain process conditions.

The system controller 850 may provide program instructions for implementing various semiconductor fabrication processes. The program instructions may control a variety of process parameters, such as DC power level, RF bias power level, pressure, temperature, etc. The instructions may control the parameters to operate in-situ deposition of film stacks.

The system controller may typically include one or more memory devices and one or more processors configured to execute the instructions so that the apparatus will perform a method in accordance with the present invention. Machine-readable media containing instructions for controlling process operations in accordance with the present invention may be coupled to the system controller.

While the semiconductor processing tool shown in FIG. 8 depicts a single, four-station process chamber, or module, other implementations of semiconductor processing tools may include multiple modules, each with a single station or multiple stations. Such modules may be interconnected with one another and/or arranged about one or more transfer chambers that may facilitate movement of wafers between the modules. One or more of the stations provided by such multi-module semiconductor processing tools may be equipped with cascade showerheads, as described herein, as needed.

Generally speaking, a cascade showerhead as described herein may be mounted in a reaction chamber above a wafer support configured to support one or more semiconductor wafers. The cascade showerhead may, for example, also serve as a lid, or part of a lid, for the reaction chamber. In other implementations, as discussed above, the cascade showerhead may be a "chandelier" type showerhead and be suspended from the lid of the reaction chamber by a stem or other support structure.

The apparatus/process described hereinabove may be used in conjunction with lithographic patterning tools or processes, e.g., steppers, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., wafer, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Another aspect of the invention is an apparatus configured to accomplish the methods described herein. A suitable apparatus includes hardware for accomplishing the process operations and a system controller having instructions for controlling process operations in accordance with the present invention. The system controller may be configured, for example, to control gas flows of the first process gas, the second process gas, and the precursor gas into the remote plasma source. The system controller may also control the RF output of the RF coils, and may control the flow rate and temperature of coolant circulated through any cooling channels in the system based on temperatures measured in the faceplate assembly using the temperature probes. The system controller will typically include one or more memory devices and one or more processors configured to execute the instructions so that the apparatus will perform a method in accordance with the present invention. Machine-readable media containing instructions for controlling process operations in accordance with the present invention may be communicatively coupled to the system controller.

While various implementations have been described herein, it should be understood that they have been presented by way of example only, and not limitation. Thus, the breadth and scope of the present disclosure should not be limited by any of the implementations described herein, but should be defined only in accordance with the following and later-submitted claims and their equivalents.

It will be understood that unless features in any of the above-described implementations are expressly identified as incompatible with one another or the surrounding context implies that they are mutually exclusive and not readily combinable in a complementary and/or supportive sense, the totality of this disclosure contemplates and envisions that specific features of those implementations can be selectively combined to provide one or more comprehensive, but slightly different, technical solutions. It will therefore be further appreciated that the above description has been given by way of example only and that modifications in detail may be made within the scope of the disclosure.

What is claimed is:

1. An apparatus for distributing gas across a semiconductor wafer, the apparatus comprising:
   a plenum volume at least partially defined by a first surface of the apparatus, a second surface of the apparatus facing the first surface, and one or more circumferential surfaces of the apparatus interposed between the first surface and the second surface;
   one or more gas inlets into the plenum volume through the first surface;
   a first annular baffle; and
   a circular baffle, the circular baffle substantially centered on the one or more gas inlets, substantially parallel to the first surface, and offset from the first surface by a first distance, wherein:
   the first annular baffle is substantially centered on the one or more gas inlets,
   the first annular baffle is substantially parallel to the first surface,
   the first annular baffle is located between the first surface and the second surface,
   the first annular baffle has an outer edge that is offset from the one or more circumferential surfaces such that a radial gap exists between the first annular baffle and the one or more circumferential surfaces,
   the first annular baffle is offset from the circular baffle by a second distance, and
   the circular baffle is between the first annular baffle and the first surface.

2. The apparatus of claim 1, wherein:
the circular baffle has a diameter,
the first annular baffle has a mid-diameter, and
the mid-diameter of the first annular baffle is substantially equal to the diameter of the circular baffle.

3. The apparatus of claim 2, further comprising:
one or more circumferential surfaces spanning between the first surface and the second surface, wherein:
one of the one or more circumferential surfaces has a diameter;
the first annular baffle has an outer diameter;
the diameter of the circular baffle is substantially half the diameter of the circumferential surface; and
the outer diameter of the first annular baffle is substantially equal to half of the sum of the diameters of the circumferential surface and the circular baffle.

4. The apparatus of claim 2, further comprising:
a second annular baffle; and
a third annular baffle, wherein:
the second annular baffle and the third annular baffle are both substantially centered on the one or more gas inlets, substantially parallel to the first surface, and offset from the first annular baffle by a third distance, wherein:
the second annular baffle and the third annular baffle are located between the first annular baffle and the second surface, and
the first annular baffle is between the circular baffle and the second annular baffle and between the circular baffle and the third annular baffle.

5. The apparatus of claim 4, wherein:
the circular baffle and the first surface are separated by a gap of approximately 0.3",
the circular baffle and the first annular baffle are separated by a gap of approximately 0.3",
the first annular baffle and the second annular baffle are separated by a gap of approximately 0.3", and
the first annular baffle and the third annular baffle are separated by a gap of approximately 0.3".

6. The apparatus of claim 4, wherein the second annular baffle and the third annular baffle are substantially co-planar with one another.

7. The apparatus of claim 4, wherein:
the first annular baffle has an inner diameter and an outer diameter,
the second annular baffle has a mid-diameter,
the third annular baffle has a mid-diameter,
the mid-diameter of the second annular baffle is substantially equal to the inner diameter of the first annular baffle, and
the mid-diameter of the third annular baffle is substantially equal to the outer diameter of the first annular baffle.

8. The apparatus of claim 4, wherein:
the first annular baffle has an inner diameter and an outer diameter,
the second annular baffle has a mid-diameter,
the third annular baffle has a mid-diameter,
the mid-diameter of the second annular baffle is within 10% of the inner diameter of the first annular baffle, and
the mid-diameter of the third annular baffle is within 10% of the outer diameter of the first annular baffle.

9. The apparatus of claim 1, wherein:
the circular baffle has a diameter,
the first annular baffle has a mid-diameter, and
the mid-diameter of the first annular baffle is within 10% of the diameter of the circular baffle.

10. The apparatus of claim 1, wherein the second surface is defined by a first side of a faceplate with a pattern of through-holes fluidly connecting the plenum volume with a second side of the faceplate opposite the first side.

11. The apparatus of claim 1, wherein the first annular baffle is formed by a plurality of arc-shaped baffle segments that form an annular shape when arranged in a circle.

12. The apparatus of claim 11, further comprising a plurality of walls, each wall substantially perpendicular to the first surface and interposed between adjoining arc-shaped baffle segments of the first annular baffle.

13. The apparatus of claim 12, wherein each wall has at least one ledge that is configured to support adjoining edges of the arc-shaped baffle segments.

14. The apparatus of claim 12, further comprising one or more circumferential surfaces spanning between the first surface and the second surface, wherein each wall is a substantially radial wall substantially extending from the one or more circumferential surfaces towards the one or more gas inlets and spanning at least between the second surface and the first annular baffle.

15. The apparatus of claim 1, further comprising:
one or more annular baffle layers, wherein:
the first annular baffle forms a first annular baffle layer of the one or more annular baffle layers,
the annular baffle layers are spaced apart from one another in a direction substantially normal to the annular baffle layers,
each annular baffle layer includes one or more annular baffles,
each annular baffle is substantially centered on the one or more gas inlets,
each annular baffle layer has twice as many annular baffles in it than the proximate annular baffle layer between that annular baffle layer and the first surface,
each annular baffle has a mid-diameter, an outer diameter, and an inner diameter, and,
for each annular baffle layer other than the first annular baffle layer, the mid-diameter of each annular baffle in that annular baffle layer is substantially equal to a different one of the inner diameter or diameters and outer diameter or diameters of the annular baffle or annular baffles in the proximate annular baffle layer between that annular baffle layer and the first surface.

16. The apparatus of claim 15, wherein each of the annular baffle layers is spaced apart from any proximate annular baffle layers by at least 0.05".

17. The apparatus of claim 15, wherein one or more of the annular baffles is formed from a plurality of arc-shaped baffle segments arranged in a substantially annular shape, and the apparatus further comprises a plurality of walls:
positioned between adjoining arc-shaped baffle segments of the annular baffles, and
configured to support the arc-shaped baffle segments within the plenum volume.

18. The apparatus of claim 1, further comprising:
one or more annular baffle layers, wherein:
the first annular baffle forms a first annular baffle layer of the one or more annular baffle layers,
the annular baffle layers are spaced apart from one another in a direction substantially normal to the annular baffle layers,
each annular baffle layer includes one or more annular baffles,
each annular baffle is substantially centered on the one or more gas inlets, each annular baffle layer has twice as many annular baffles in it than the proximate annular baffle layer between that annular baffle layer and the first surface, each annular baffle has a mid-diameter, an outer diameter, and an inner diameter, and, for each annular baffle layer other than the first annular baffle layer, the mid-diameter of each annular baffle in that annular baffle layer is within 10% of the different one of the inner diameter or diameters and the outer diameter or diameters of the annular baffle or annular baffles in the proximate annular baffle layer between that annular baffle layer and the first surface.

19. A semiconductor processing station, the semiconductor processing station including the apparatus of claim 1.

20. A semiconductor processing tool, the semiconductor processing tool including the semiconductor processing station of claim 19.

21. The semiconductor processing tool of claim 20, wherein the semiconductor processing tool includes a stepper.

22. An apparatus for distributing gas across a semiconductor wafer, the apparatus comprising:
a plenum volume at least partially defined by a first surface of the apparatus, a second surface of the apparatus facing the first surface, and one or more circumferential surfaces of the apparatus interposed between the first surface and the second surface;
one or more gas inlets into the plenum volume through the first surface;
a first annular baffle; and
a backplate, wherein:
the first annular baffle is substantially centered on the one or more gas inlets,
the first annular baffle is substantially parallel to the first surface,
the first annular baffle is located between the first surface and the second surface,
the first annular baffle has an outer edge that is offset from the one or more circumferential surfaces such that a radial gap exists between the first annular baffle and the one or more circumferential surfaces, and
the backplate provides the first surface and the one or more gas inlets are arranged to distribute gas onto the first annular baffle.

23. The apparatus of claim 22, further comprising:
a second annular baffle; and
a third annular baffle, wherein:
the second annular baffle and the third annular baffle are both substantially centered on the one or more gas inlets, substantially parallel to the first surface, and offset from the first annular baffle by a third distance, wherein:
the second annular baffle and the third annular baffle are located between the first annular baffle and the second surface, and
the first annular baffle is between the first surface and the second annular baffle and between the first surface and the third annular baffle.

24. The apparatus of claim 23, wherein the second annular baffle and the third annular baffle are substantially co-planar with one another.

25. The apparatus of claim 23, wherein:
the first annular baffle has an inner diameter and an outer diameter,
the second annular baffle has a mid-diameter,
the third annular baffle has a mid-diameter,
the mid-diameter of the second annular baffle is substantially equal to the inner diameter of the first annular baffle, and
the mid-diameter of the third annular baffle is substantially equal to the outer diameter of the first annular baffle.

26. The apparatus of claim 23, wherein:
the first annular baffle has an inner diameter and an outer diameter,
the second annular baffle has a mid-diameter,
the third annular baffle has a mid-diameter,
the mid-diameter of the second annular baffle is within 10% of the inner diameter of the first annular baffle, and
the mid-diameter of the third annular baffle is within 10% of the outer diameter of the first annular baffle.

27. The apparatus of claim 22, wherein the second surface is defined by a first side of a faceplate with a pattern of through-holes fluidly connecting the plenum volume with a second side of the faceplate opposite the first side.

28. The apparatus of claim 22, wherein the first annular baffle is formed by a plurality of arc-shaped baffle segments that form an annular shape when arranged in a circle.

29. The apparatus of claim 28, further comprising a plurality of walls, each wall substantially perpendicular to the first surface and interposed between adjoining arc-shaped baffle segments of the first annular baffle.

30. The apparatus of claim 29, wherein each wall has at least one ledge that is configured to support adjoining edges of the arc-shaped baffle segments.

31. The apparatus of claim 29, further comprising one or more circumferential surfaces spanning between the first surface and the second surface, wherein each wall is a substantially radial wall substantially extending from the one or more circumferential surfaces towards the one or more gas inlets and spanning at least between the second surface and the first annular baffle.

32. The apparatus of claim 22, further comprising:
one or more annular baffle layers, wherein:
the first annular baffle forms a first annular baffle layer of the one or more annular baffle layers,
the annular baffle layers are spaced apart from one another in a direction substantially normal to the annular baffle layers,
each annular baffle layer includes one or more annular baffles,
each annular baffle is substantially centered on the one or more gas inlets,
each annular baffle layer has twice as many annular baffles in it than the proximate annular baffle layer between that annular baffle layer and the first surface,
each annular baffle has a mid-diameter, an outer diameter, and an inner diameter, and,
for each annular baffle layer other than the first annular baffle layer, the mid-diameter of each annular baffle in that annular baffle layer is substantially equal to a different one of the inner diameter or diameters and outer diameter or diameters of the annular baffle or annular baffles in the proximate annular baffle layer between that annular baffle layer and the first surface.

33. The apparatus of claim 32, wherein each of the annular baffle layers is spaced apart from any proximate annular baffle layers by at least 0.05".

34. The apparatus of claim 32, wherein one or more of the annular baffles is formed from a plurality of arc-shaped baffle segments arranged in a substantially annular shape, and the apparatus further comprises a plurality of walls:
positioned between adjoining arc-shaped baffle segments of the annular baffles, and configured to support the arc-shaped baffle segments within the plenum volume.

35. The apparatus of claim 22, further comprising:
one or more annular baffle layers, wherein:
- the first annular baffle forms a first annular baffle layer of the one or more annular baffle layers,
- the annular baffle layers are spaced apart from one another in a direction substantially normal to the annular baffle layers,
- each annular baffle layer includes one or more annular baffles,
- each annular baffle is substantially centered on the one or more gas inlets,
- each annular baffle layer has twice as many annular baffles in it than the proximate annular baffle layer between that annular baffle layer and the first surface,
- each annular baffle has a mid-diameter, an outer diameter, and an inner diameter, and
- for each annular baffle layer other than the first annular baffle layer, the mid-diameter of each annular baffle in that annular baffle layer is within 10% of the different one of the inner diameter or diameters and the outer diameter or diameters of the annular baffle or annular baffles in the proximate annular baffle layer between that annular baffle layer and the first surface.

\* \* \* \* \*